(12) United States Patent
Dong et al.

(10) Patent No.: US 11,742,377 B2
(45) Date of Patent: Aug. 29, 2023

(54) LIGHT EMITTING DIODE CHIP, DISPLAY DEVICE AND METHOD FOR MANUFACTURING THE SAME

(71) Applicant: BOE TECHNOLOGY GROUP CO., LTD., Beijing (CN)

(72) Inventors: Xue Dong, Beijing (CN); Guangcai Yuan, Beijing (CN); Qi Yao, Beijing (CN); Zhanfeng Cao, Beijing (CN); Shi Shu, Beijing (CN); Mingxing Wang, Beijing (CN); Xiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 127 days.

(21) Appl. No.: 17/488,243

(22) Filed: Sep. 28, 2021

(65) Prior Publication Data
US 2022/0238594 A1 Jul. 28, 2022

(30) Foreign Application Priority Data
Jan. 28, 2021 (CN) .......................... 202110119525.7

(51) Int. Cl.
*H01L 25/00* (2006.01)
*H01L 27/15* (2006.01)
*H01L 25/065* (2023.01)

(52) U.S. Cl.
CPC ........ *H01L 27/156* (2013.01); *H01L 25/0655* (2013.01); *H01L 25/50* (2013.01)

(58) Field of Classification Search
None
See application file for complete search history.

(56) References Cited

FOREIGN PATENT DOCUMENTS

| CN | 114566581 A | * | 5/2022 |
| CN | 115172390 A | * | 10/2022 |
| CN | 115394763 A | * | 11/2022 |
| CN | 115457872 A | * | 12/2022 |

* cited by examiner

*Primary Examiner* — Michael Lebentritt
(74) *Attorney, Agent, or Firm* — Houtteman Law LLC

(57) ABSTRACT

A LED chip, including: substrate; LEDs on side of the substrate, each including first semiconductor pattern, light emission pattern, second semiconductor pattern sequentially stacked, the first semiconductor patterns of at least two LEDs being formed as single piece to constitute first semiconductor layer; at least one first electrode on side of first semiconductor layer away from the substrate and electrically coupled to first semiconductor layer; second electrodes on side of the second semiconductor patterns away from the substrate, each being electrically coupled to second semiconductor pattern of corresponding LED; pixel defining layer on side of the substrate away from LED, and having pixel openings in one-to-one correspondence with LEDs; and a color conversion pattern within at least two pixel openings, and converting light of first color emitted by the light emission pattern into light of target color other than the first color. The LED chip is Mini-LED or Micro-LED chip.

20 Claims, 15 Drawing Sheets

LIGHT EMITTING DIODE CHIP, DISPLAY DEVICE AND METHOD FOR MANUFACTURING THE SAME

CROSS-REFERENCE TO RELATED APPLICATION

The disclosure claims priority from Chinese Patent Application No. 202110119525.7, filed on Jan. 28, 2021 to China National Intellectual Property Administration, the contents of which are incorporated herein by reference in the entirety.

TECHNICAL FIELD

The disclosure relates to the field of display, in particular to a light emitting diode chip, a display device and a method for manufacturing the same.

BACKGROUND

Because of its many advantages such as high efficiency, high brightness, high reliability, energy saving and fast response speed, and significant advantages in image quality, refresh rate, power consumption and brightness compared with a liquid crystal display (LCD) device and an organic light emitting diode (OLED) display device, the Mini/Micro light-emitting-diode (LED) display device is widely applied to the fields of traditional display, near-to-eye display, three-dimensional (3D) display and transparent display.

SUMMARY

The disclosure provides a light emitting diode chip and a manufacturing method thereof, and a display device and a manufacturing method thereof.

In a first aspect, embodiments of the disclosure provide a light emitting diode (LED) chip, including: a substrate; a plurality of LEDs on a side of the substrate, each of the LEDs including a first semiconductor pattern, a light emission pattern, and a second semiconductor pattern which are sequentially stacked, the first semiconductor patterns of at least two of the LEDs being formed as a single piece to constitute a first semiconductor layer; at least one first electrode on a side of the first semiconductor layer away from the substrate and electrically coupled to the first semiconductor layer; a plurality of second electrodes on a side of the second semiconductor patterns away from the substrate, each of the second electrodes being electrically coupled to the second semiconductor pattern of a corresponding one of the LEDs; a pixel defining layer on a side of the substrate away from the LEDs, and having a plurality of pixel openings in one-to-one correspondence with the LEDs; and a color conversion pattern within at least two of the pixel openings, the color conversion pattern being configured to convert light of a first color emitted by the light emission pattern into light of a target color other than the first color. The LED chip is a Mini-LED chip or a Micro-LED chip.

In some embodiments, the LED chip further includes: a first light shielding layer between the pixel defining layer and the substrate in a vertical direction, and between adjacent ones of the LEDs when viewed in a plan view, the first light shielding layer being configured to shield light emitted by at least one of the adjacent LEDs and refracted by the substrate and then transmitted toward a pixel opening, other than the pixel opening corresponding to the at least one LED, among the plurality of pixel openings.

In some embodiments, the first light shielding layer includes at least one light shielding pattern between two of the LEDs adjacent in a preset direction when viewed in a plan view, and a minimum width W of the light shielding pattern in the preset direction satisfies:

$$W \geq 2*H*\tan\theta - D,$$

where H is a distance between a surface of the light emission pattern of the LED away from the substrate and a surface of the substrate close to the pixel defining layer, $\theta$ is a critical angle of total reflection of light from the substrate to an outside of the substrate, and D is a minimum distance, in a preset direction, between the two LEDs adjacent in the preset direction.

In some embodiments, the pixel defining layer include a light shielding material or a light reflective material.

In some embodiments, the color conversion patterns in different ones of the pixel openings convert the light of the first color emitted from the light emission patterns into light of target colors different from each other, respectively, and the LED chip further includes: a color filter layer on a side of the pixel defining layer away from the substrate and including a plurality of first color filter patterns in one-to-one correspondence with the color conversion patterns, each of the first color filter patterns being configured to block light of a color other than the target color converted by the color conversion pattern corresponding to the first color filter pattern.

In some embodiments, an orthographic projection of each pixel opening on the substrate completely covers an orthographic projection of the light emission pattern of the LED corresponding to the pixel opening on the substrate.

In some embodiments, the LED chip further includes: a light transmissive pattern within a pixel opening, in which the color conversion pattern is not disposed, of the plurality of pixel openings, the light transmissive pattern being configured to allow light of the first color to pass therethrough.

In some embodiments, the light transmissive pattern includes a light field modulation pattern configured to adjust a light-exit angular spectral distribution of the light of the first color at the pixel openings.

In some embodiments, the LED chip further includes a second color filter pattern on a side of the pixel defining layer and the light transmissive pattern away from the substrate, an orthographic projection of the second color filter pattern on the substrate at least partially overlaps an orthographic projection of the light transmissive pattern on the substrate, and the second color filter pattern is configured to block light of a color other than the first color.

In some embodiments, an area of an orthographic projection, on the substrate, of a pixel opening within which the light transmissive pattern is disposed is smaller than or equal to an area of an orthographic projection, on the substrate, of a pixel opening in which the color conversion pattern is disposed.

In some embodiments, the light of the first color includes blue light, and the light of the target color includes at least one of red light, green light, cyan light, magenta light, or yellow light.

In some embodiments, the LED chip further includes a third light shielding layer in gaps between the plurality of LEDs and made of a light shielding material.

In some embodiments, at least a portion of the third light shielding layer protrudes in a vertical direction beyond a surface of the light emission pattern away from the second semiconductor pattern.

In some embodiments, the LED chip further includes: a buffer layer between the substrate and the first semiconductor layer, the buffer layer having a lattice coefficient and a thermal expansion coefficient closer to those of the first semiconductor layer than the substrate.

In a second aspect, embodiments of the disclosure provide a method for manufacturing a LED chip, the LED chip being a Mini-LED chip or a Micro-LED chip, and the method includes: providing a substrate; forming a plurality of LEDs on a side of the substrate, each of the LEDs including a first semiconductor pattern, a light emission pattern, and a second semiconductor pattern which are sequentially stacked, the first semiconductor patterns of at least two of the LEDs being formed as a single piece to constitute a first semiconductor layer; forming at least one first electrode on a side of the first semiconductor layer away from the substrate, the first electrode being electrically coupled to the first semiconductor layer; forming a plurality of second electrodes on a side of the second semiconductor patterns away from the substrate, each of the second electrodes being electrically coupled to the second semiconductor pattern of a corresponding one of the LEDs; forming a pixel defining layer on a side of the substrate away from the LEDs, the pixel defining layer having a plurality of pixel openings in one-to-one correspondence with the LEDs; forming a color conversion pattern within at least two of the pixel openings, the color conversion pattern being configured to convert light of a first color emitted by the light emission pattern to light of a target color other than the first color.

In some embodiments, before the forming of a pixel defining layer on a side of the substrate away from the LEDs, the method further includes: forming a first light shielding layer on a side of the substrate away from the LEDs, the first light shielding layer being between adjacent ones of the LEDs when viewed in a plan view, and configured to shield light that is emitted by at least one of the adjacent LEDs, refracted by the substrate, and then transmitted towards a pixel openings, other than the pixel opening corresponding to the at least one LED, of the plurality of pixel openings.

In a third aspect, embodiments of the disclosure provide a display device, including: a driving backplane including a plurality of connection pads, the connection pads including a plurality of first pads and a plurality of second pads; a plurality of LED chips, each LED chip being the above LED chip, the first pads being electrically coupled to the first electrodes of the LED chips in a one-to-one correspondence manner, and the second pads being electrically coupled to the second electrodes of the LED chips in a one-to-one correspondence manner.

In some embodiments, the display device further includes: an encapsulation layer on a side of the LED chip away from the driving backplane; and a second light shielding layer, which is between the driving backplane and the encapsulation layer in the vertical direction, and between any two adjacent ones of the LED chips in the horizontal direction.

In a fourth aspect, embodiments of the disclosure provide a method for manufacturing a display device, including: manufacturing a plurality of LED chips by adopting the above method; providing a driving backplane which includes a plurality of connection pads, the connection pads including a plurality of first pads and a plurality of second pads; electrically connecting the plurality of first pads with the first electrodes of the LED chips in a one-to-one correspondence manner and electrically connecting the plurality of second pads with the second electrodes of the LED chips in a one-to-one correspondence manner.

In some embodiments, after the electrically connecting the plurality of first pads and the first electrodes of the LED chips in a one-to-one correspondence, and the electrically connecting the plurality of second pads and the second electrodes of the LED chips in a one-to-one correspondence, the method further includes: forming a second light shielding layer on a side of the driving backplane close to the LED chips, the second light shielding layer being between any two adjacent LED chips in the horizontal direction; and forming an encapsulation layer on a side of the LED chips away from the driving backplane.

DETAILED DESCRIPTION

Figure 1:
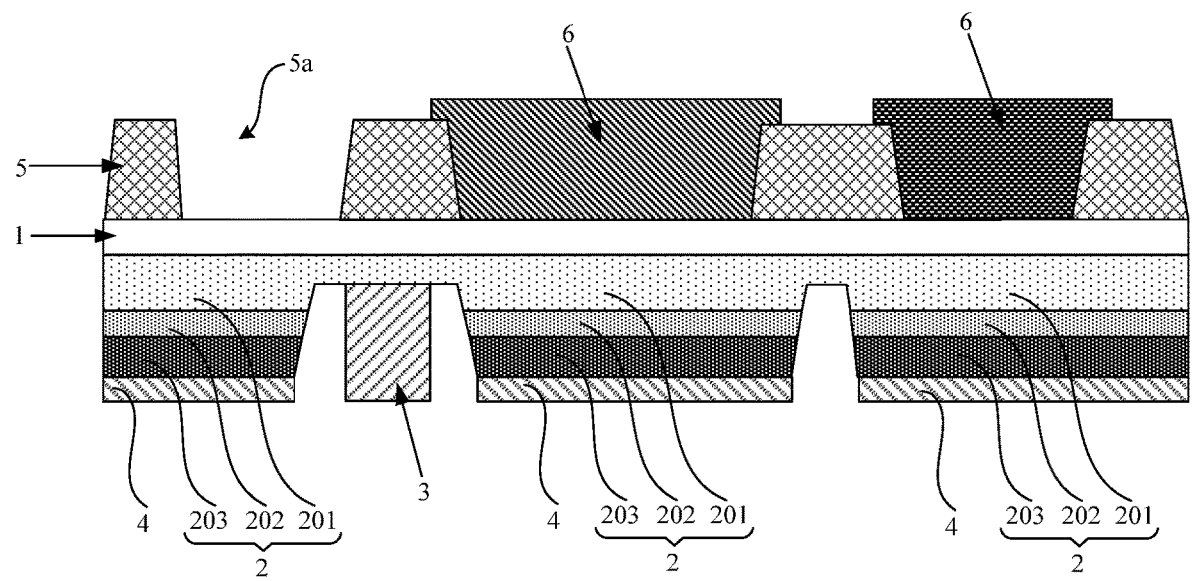
FIG. 1 is a schematic cross-sectional view of an LED chip according to an embodiment of the disclosure.

To make those skilled in the art better understand the technical solutions of the disclosure, a LED chip, a display device and a manufacturing method thereof according to the disclosure will be further described in detail below in conjunction with the accompanying drawings.

The technical solutions in some embodiments of the disclosure will be clearly and completely described below in conjunction with the accompanying drawings, and it is to be understood that the described embodiments are only a part of the embodiments of the disclosure, and not all of the embodiments. All other embodiments obtained by a person of ordinary skill in the art based on the embodiments provided in the disclosure are within the scope of protection of the disclosure.

Unless the context requires otherwise, throughout the description and the claims, the word "include" and its other forms, such as "includes" and "including", will be interpreted as open, inclusive meaning, that is, the word "include" and "includes" will be interpreted as "including, but not limited to". In the description of the specification, the term "one embodiment", "some embodiments", "exemplary embodiments", "example", "specific example", "some examples" or the like is intended to indicate that a particular feature, structure, material, or property in connection with the embodiment or example is included in at least one embodiment or example of the disclosure. The illustrative expression of the above terms does not necessarily refer to the same embodiment or example. Furthermore, the particular feature, structure, material, or property may be included in any suitable manner in any one or more embodiments or examples.

Hereinafter, the terms "first", "second" are used for descriptive purposes only and are not to be understood as indicating or implying relative importance or implicitly indicating the number of technical features indicated. Thus, a feature defined with a term "first" or "second" may explicitly or implicitly include one or more of these features. In the description of the embodiments of the disclosure, "a plurality" means two or more unless otherwise specified.

In describing some embodiments, the expression "couple" and derivatives thereof may be used. For example, the term "couple" may be used in describing some embodiments to indicate that two or more elements are in direct physical or electrical contact with each other. The embodiments disclosed herein are not necessarily limited to the contents herein.

The expression "at least one of A, B and C" has the same meaning as "at least one of A, B or C", both including the following combinations of A, B and C: only A, only B, only C, a combination of A and B, a combination of A and C, a combination of B and C, and a combination of A, B and C.

"A and/or B" includes the following three combinations: only A, only B, and a combination of A and B.

As used herein, the term "if" is optionally to be interpreted as "when" or "at a time when . . . " or "in response to a determination" or "in response to a detection", depending on the context. Similarly, the phrase "if it is determined . . . " or "if [the stated condition or event] is detected" is optionally to be interpreted as "upon determining . . . " or "in response to determining . . . " or "upon detecting [the stated condition or event] or "in response to detecting [the stated condition or event]", depending on the context.

The use of "adapted to" or "configured to" herein means open and inclusive language that does not exclude devices adapted to or configured to perform additional tasks or steps.

As used herein, "about" or "approximately" includes the stated value as well as an average value within a range of acceptable deviations for the particular value as determined by one of ordinary skill in the art in consideration of the discussed measurement and the error associated with the measurement for the particular quantity (i.e., limitations of a measurement system).

Exemplary embodiments are described herein with reference to cross-sectional and/or plan views as idealized illustrative figures. In the drawings, the thickness of layers and regions are exaggerated for clarity. Thus, variations of the shape relative to the drawings, such as manufacturing techniques and/or tolerances, are to be expected. Thus, exemplary embodiments should not be construed as limited to the shapes of regions illustrated herein, but are to include deviations in shapes that result, for example, from manufacturing. For example, an etched region shown as a rectangle will typically have curved features. Thus, the regions shown in the figures are illustrative in nature and their shapes are not intended to show the actual shape of a region of a device and are not intended to limit the scope of exemplary embodiments.

An LED display device generally includes a driving backplane and a plurality of Mini/Micro LED chips electrically coupled to the driving backplane, and the plurality of Mini/Micro LED chips are generally transferred onto the driving backplane by a mass transfer technology. In the existing art, a single Mini/Micro LED chip only has one LED, and each LED chip can be used as one sub-pixel of a display device. In this case, in order to implement a display device with a corresponding resolution, the number of sub-pixels is the number of required LED chips. Since the Mini/Micro LED chips cannot be directly formed on an array substrate of the display device through a thin-film-and-patterning process, but need to be electrically coupled to corresponding electrodes of the array substrate through transfer and bonding, the number of LED chips that need to be transferred increases as the resolution of the display device increases and the number of sub-pixels increases, so that the number of transfers increases, the process becomes more difficult, and the product yield decreases.

In addition, in the existing art, since a single Mini/Micro LED chip only has one LED, it can emit light of only one color, and thus, in order to realize multi-color display of the LED display device, LED chips emitting light of different colors need to be transferred to the driving backplane respectively, and there are differences in the manufacturing processes and yields for these Mini/Micro LED chips emitting light of different colors. When the Mini/Micro LED chips with different qualities are applied to the same display device, the problem of uneven brightness of the display screen may occur.

In order to solve at least one technical problem of the existing art, the embodiments of the disclosure provide a corresponding solution.

FIG. 1 is a schematic cross-sectional view of an LED chip according to an embodiment of the disclosure. As shown in FIG. 1, the LED chip according to an embodiment of the disclosure may be a sub-millimeter LED (Mini LED) chip or a micro LED chip. The LED chip includes a substrate 1, a plurality of LEDs 2, at least one first electrode 3, a plurality of second electrodes 4, a pixel defining layer 5 and a color conversion pattern 6.

The plurality of LEDs 2 are positioned on a side of the substrate 1, and a gap is arranged between any two adjacent LEDs 2. The LED 2 includes a first semiconductor pattern 201, a light emission pattern 202 and a second semiconductor pattern 203 which are sequentially stacked, and the first semiconductor patterns 201 of at least two LEDs 2 are integrally formed as a single piece to constitute a first semiconductor layer. The first electrode 3 is positioned on a side of the first semiconductor layer away from the substrate 1, and the first electrode 3 is electrically coupled to the first semiconductor layer. The plurality of second electrodes 4 are positioned on a side of the second semiconductor patterns 203 away from the substrate 1, and each second electrode 4 is electrically coupled to the second semiconductor pattern 203 of a corresponding one of the LEDs 2. The pixel defining layer 5 is positioned on a side of the substrate 1 away from the LEDs 2, and has a plurality of pixel openings 5a therein in one-to-one correspondence with the LEDs 2. The color conversion pattern 6 is disposed in at least some of the pixel openings 5a, and configured to convert light of a first color emitted by the light emission pattern 202 into light of a target color other than the first color. The color conversion patterns 6 disposed in different pixel openings may convert the first color of the light emitted from the corresponding light emission patterns 202 into target colors different from each other.

In an embodiment of the disclosure, one first semiconductor layer may be electrically coupled to one or more first electrodes 3, and each second electrode 4 is electrically coupled to one second semiconductor pattern 203.

In some embodiments, the first semiconductor pattern 201 may be in direct contact with the light emission pattern 202, and the light emission pattern 202 may be in direct contact with the second semiconductor pattern 203. The material of the first semiconductor pattern 201 may be a P-type semiconductor material, and accordingly, the material of the second semiconductor pattern 203 may be an N-type semiconductor material. Alternatively, the material of the first semiconductor pattern 201 may be an N-type semiconductor material, and accordingly, the material of the second semiconductor pattern 203 may be a P-type semiconductor material. The light emission pattern 202 may be a multiple quantum well (MQW) layer, and the material of the light emission pattern 202 may be gallium nitride (GaN), for example. In practical applications, the materials of the first semiconductor pattern 201 and the second semiconductor pattern 203 include various materials, which can be selected according to practical requirements. As an example, the intrinsic semiconductor materials of the first and second semiconductor patterns 201 and 203 are the same, and may be any one of GaN, gallium phosphide (GaP), aluminum gallium arsenide (AlGaAs), and aluminum gallium indium phosphide (AlGaInP). In the case where different voltages are applied to the first and second semiconductor patterns 201 and 203, respectively, to form an electric field therebetween, if the intrinsic semiconductor materials of the first and second semiconductor patterns 201 and 203 are both GaN, the LED 2 may emit green or blue light; if the intrinsic semiconductor materials of the first and second semiconductor patterns 201 and 203 are both GaP, AlGaAs, or AlGaInP, the LED 2 may emit red light.

It should be noted that, when different voltages are applied to the first semiconductor pattern 201 and the second semiconductor pattern 203 to form an electric field therebetween, that is, when a PN junction having a potential barrier is formed between the first semiconductor pattern 201 and the second semiconductor pattern 203, when minority carriers and majority carriers are recombined in an overlapping region of the first semiconductor pattern 201, the light emission pattern 202, and the second semiconductor pattern 203 in the stacking direction, excess energy is released in the form of light, thereby directly converting electric energy into optical energy. Therefore, the overlapping region of the three in the stacking direction is substantially the light emitting region of the LED 2, and the area of the overlapping region of the three in the stacking direction is substantially the light emitting area of the LED 2.

In the embodiments of the disclosure, there a gap between any adjacent two LEDs 2 (for example, between the light emission patterns 202 or the second semiconductor patterns 203 of the adjacent two LEDs 2) of the plurality of LEDs 2 located on the same LED chip. This means that each LED 2 may have a separate light emitting region. The plurality of LEDs 2 included in the LED chip may enable the LED chip to have a plurality of separate light emitting regions. In the case of applying the LED chip to the display device, one or more (e.g., two or three, etc.) light emitting regions of the LED chip may correspond to one sub-pixel of the display device, which means that one LED chip may correspond to a plurality of sub-pixels of the LED display device. As such, in the process of transferring the LED chips, one LED chip corresponding to a plurality of sub-pixels can be transferred, and compared with the case where one LED chip corresponding to only one sub-pixel is transferred in the existing art, the technical solution of the disclosure can effectively reduce the number of the LED chips which need to be transferred, thereby effectively reducing the transfer times, reducing the process difficulty and improving the product yield.

In addition, by disposing the pixel defining layer 5 on the side of the substrate 1 away from the LEDs 2 and disposing the color conversion pattern 6 in at least some of the pixel openings 5a of the pixel defining layer 5, the colors of light emitted from respective pixel openings 5a corresponding to the LEDs 2 can be different, that is, the LEDs 2 on the same LED chip have the same quality, and can meet the requirements of the display device for colorful and even full-color display.

In the embodiment of the disclosure, the material of the color conversion pattern 6 is a wavelength conversion material, for example, cadmium quantum dots, indium quantum dots, perovskite quantum dots, rare earth phosphors, organic fluorescent materials, etc., which converts, through its wavelength conversion property, the first color of light emitted by the LED 2 into another color, thereby realizing a multi-color or even full-color display.

FIG. 1 illustrates a case of three LEDs 2, three pixel openings 5a, and color conversion patterns disposed in two pixel openings 5a merely for exemplary purposes, which does not limit the technical solution of the disclosure.

In the embodiments of the disclosure, the shape of the orthographic projection of the LED 2 on the substrate 1 may include at least one of a polygon (e.g., a triangle, a rectangle, a hexagon, etc.), a circle, and an ellipse. The shape of the orthographic projection of the pixel opening 5a corresponding to the LED 2 on the substrate 1 may include at least one of a polygon (e.g., a triangle, a rectangle, a hexagon, etc.), a circle, and an ellipse.

Figure 2:
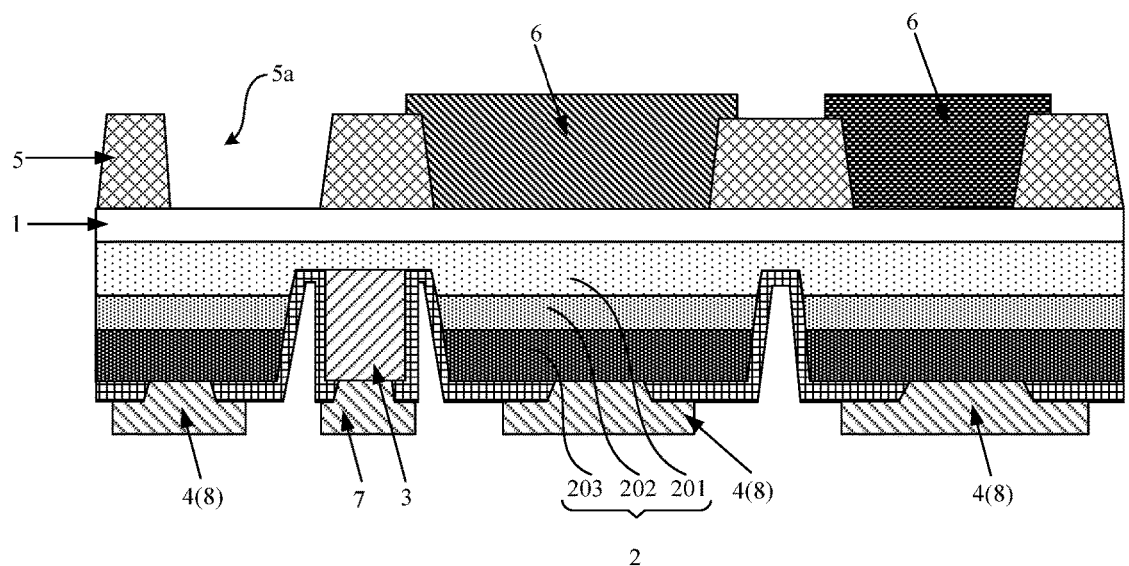
FIG. 2 is a schematic cross-sectional view of another LED chip according to an embodiment of the disclosure.

FIG. 2 is a schematic cross-sectional view of another LED chip according to an embodiment of the disclosure. As shown in FIG. 2, unlike the case shown in the previous embodiments, the LED chip shown in FIG. 2 further includes first and second conductive pins 7 and 8, the first conductive pin 7 corresponds to at least one first electrode 3, and the second conductive pins 8 correspond to the second electrodes 4 one by one. The first conductive pin 7 is located on a side of the second electrodes 4 away from the first semiconductor layer and electrically coupled to the corresponding first electrode 3, and the second conductive pin 8 is electrically coupled to the second electrode 4.

The first and second conductive pins 7 and 8 are respectively used as leading-out terminals of the first electrode 3 and the second electrode 4, and may be soldered to a bonding pad on the driving backplane, so that the soldering position on the LED chip is more flexible; in addition, the first electrode 3 and the second electrode 4 are not in direct contact with the bonding pad on the driving backplane, thereby protecting the first electrode 3 and the second electrode 4 to some extent.

In some embodiments, the first and second conductive pins 7 and 8 and the second electrodes 4 are disposed in a same layer. It should be noted that "in a(the) same layer" in the disclosure refers to layer structures that are formed by forming a layer film for a specific pattern by the same film formation process and then performing a patterning process once using the same mask plate. Depending on the specific pattern, the patterning process performed once may include multiple processes of exposure, development or etching; the specific pattern in the layer structure may be continuous or discontinuous, and the specific patterns may be at different heights or have different thicknesses. Therefore, the first and second conductive pins 7 and 8 and the second electrode 4 can be simultaneously prepared and formed in the patterning process performed once, which is beneficial to simplifying the manufacturing process of the LED chip.

In some embodiments, an insulating layer is disposed between the second electrode 4 and the second semiconductor pattern 203, the second electrode 4 is electrically coupled to the corresponding second semiconductor pattern 203 through a via hole in the insulating layer, and the first conductive pin 7 is electrically coupled to the corresponding first electrode 3 through a via hole in the insulating layer.

Figure 3:
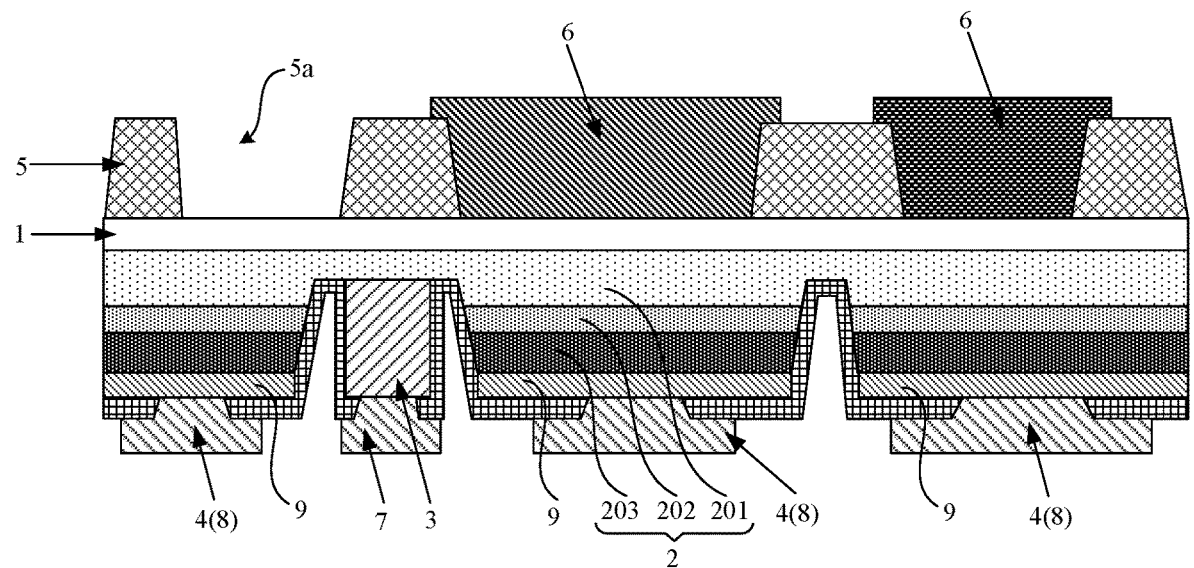
FIG. 3 is a schematic cross-sectional view of another LED chip according to an embodiment of the disclosure.

FIG. 3 is a schematic cross-sectional view of another LED chip according to an embodiment of the disclosure. As shown in FIG. 3, unlike the case shown in the previous embodiments, an ohmic contact pattern 9 is disposed between the second electrode 4 and the corresponding second semiconductor pattern 203 and the second electrode 4 is electrically coupled to the corresponding second semiconductor pattern 203 through the ohmic contact pattern 9, in the case shown in FIG. 3. In some embodiments, an orthographic projection of the ohmic contact pattern 9 on the substrate 1 is coincident or substantially coincident with an orthographic projection of the corresponding second semiconductor pattern 203 on the substrate 1, so that the mobility of carriers (e.g., holes) can be effectively increased by the ohmic contact pattern 9. The material of the ohmic contact pattern 9 includes various materials, and may be selected according to actual needs. In some embodiments, the material of the ohmic contact pattern 9 may be a material having a high light transmittance, such as Indium Tin Oxide (ITO).

Figure 4:
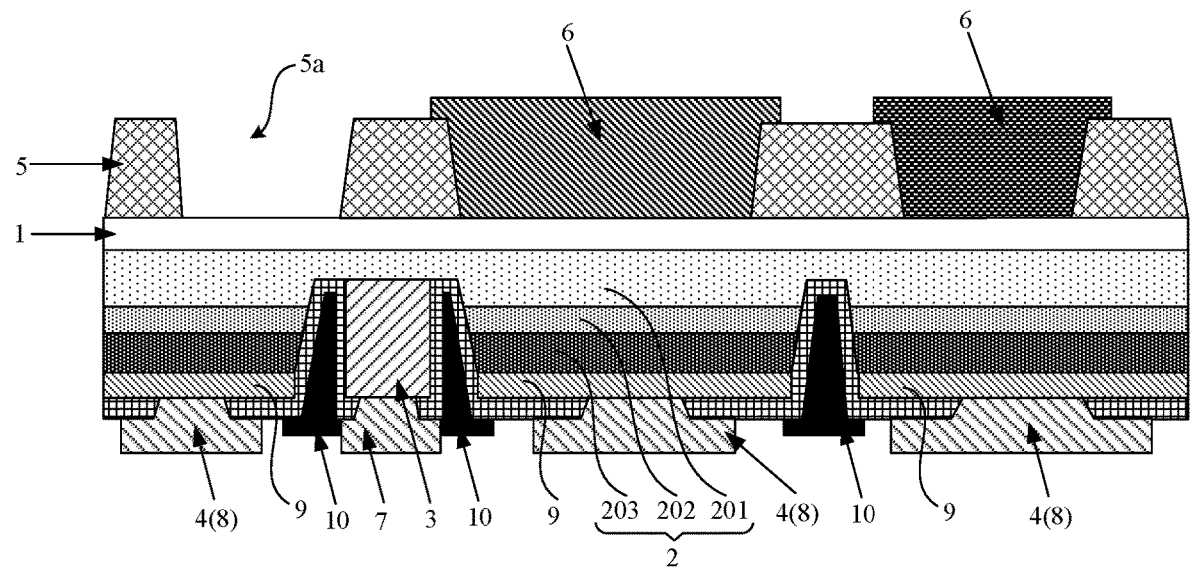
FIG. 4 is a schematic cross-sectional view of another LED chip according to an embodiment of the disclosure.

FIG. 4 is a schematic cross-sectional view of another LED chip according to an embodiment of the disclosure. As shown in FIG. 4, different from the case shown in the previous embodiments, a third light shielding layer 10 is disposed at a gap between two adjacent LEDs 2 in the case shown in FIG. 4, and the third light shielding layer 10 is configured to prevent superposition and interference of light emitted from the adjacent LEDs 2. In some embodiments, the material of the third light shielding layer 10 may include light shielding materials of dark colors such as black, green, blue, etc.

In some embodiments, at least a portion of the third light shielding layer 10 protrudes beyond a surface of the light emission pattern 202 away from the second semiconductor pattern 203 in the vertical direction. For example, referring to FIG. 4, the upper end of the third light shielding layer 10 protrudes beyond the upper surface of the light emission pattern 202 to extend into the first semiconductor pattern 201.

Figure 5:
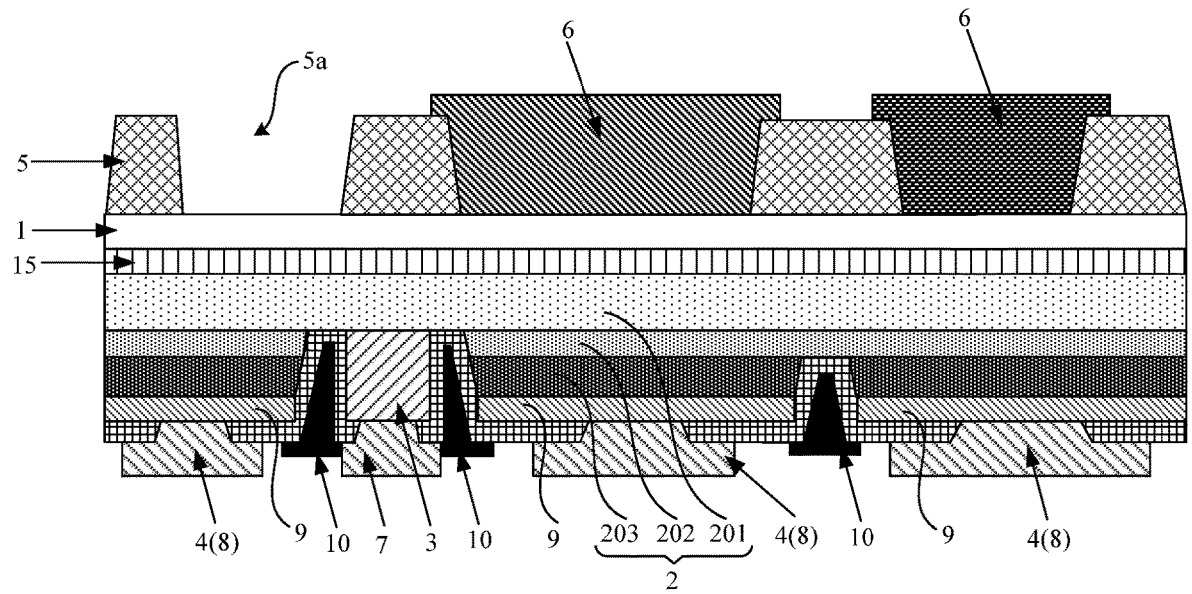
FIG. 5 is a schematic cross-sectional view of another LED chip according to an embodiment of the disclosure.

FIG. 5 is a schematic cross-sectional view of another LED chip according to an embodiment of the disclosure. As shown in FIG. 5, unlike the case shown in the previous embodiments, at least some of the light emission patterns 202 in the LEDs 2 are integrally formed as a single piece in the case shown in FIG. 5.

Taking the case shown in FIG. 5 as an example, the light emission patterns 202 of one LED 2 located in the middle and an adjacent LED 2 at the right side are formed integrally as a single piece.

With continued reference to FIGS. 2 to 5, in some embodiments, a buffer layer 15 is further disposed between the first semiconductor layer and the substrate 1.

In the existing art, the lattice coefficients and the thermal expansion coefficients of the first semiconductor layer and the substrate are different greatly, so it is difficult to prepare a high-quality first semiconductor layer directly on the substrate. In the embodiments of the disclosure, by providing the buffer layer 15 between the first semiconductor layer and the substrate 1, the film formation quality of the first semiconductor layer can be effectively improved. The material of the buffer layer 15 may be selected according to the materials of the substrate and the first semiconductor layer. For example, compared with the lattice coefficient and the thermal expansion coefficient of the substrate 1, the lattice coefficient and the thermal expansion coefficient of the buffer layer are closer to those of the first semiconductor layer. For example, the material of the first semiconductor layer is GaN, the substrate 1 is a sapphire substrate, and in this case, the material of the buffer layer 15 may be AlN or ZnO; taking the material of the buffer layer 15 being AlN as an example, AlN and GaN belong to the same material system, their lattice mismatch is only 2%, and their thermal expansion coefficients are similar, and thus mobility of the GaN material grown on the AlN buffer layer 15 is increased by nearly 10 times as compared with mobility of the GaN material grown directly on a sapphire substrate.

Figure 6:
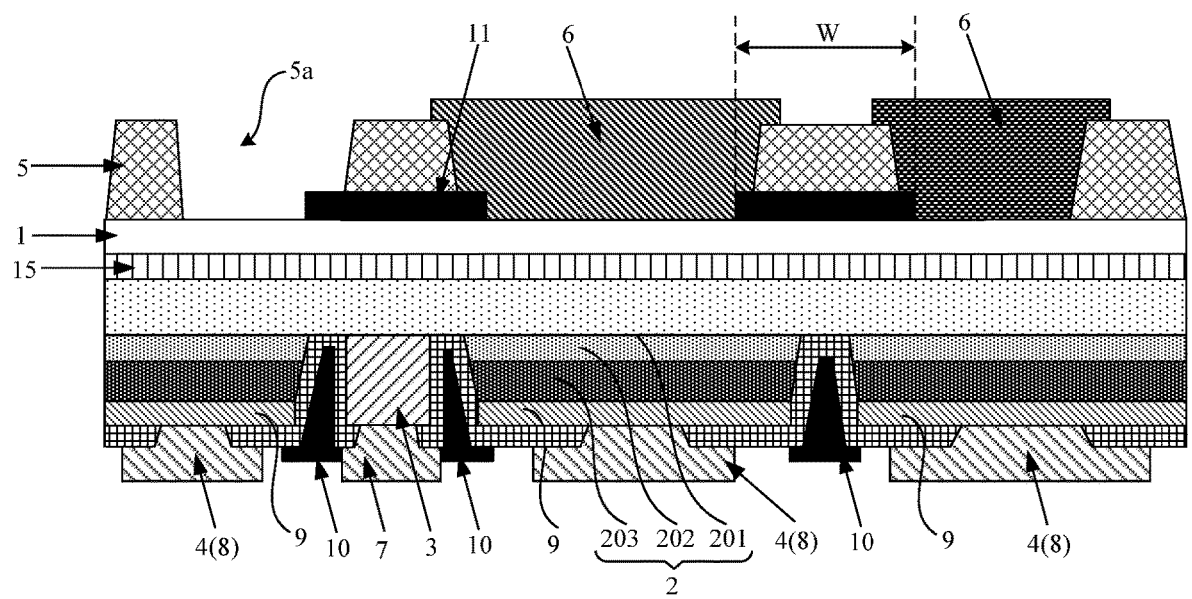
FIG. 6 is a schematic cross-sectional view of another LED chip according to an embodiment of the disclosure.

FIG. 6 is a schematic cross-sectional view of another LED chip according to an embodiment of the disclosure. As shown in FIG. 6, unlike the case shown in the previous embodiments, the LED chip shown in FIG. 6 further includes: a first light shielding layer between the pixel defining layer 5 and the substrate 1 in a vertical direction, and between adjacent LEDs when viewed in a plan view. The first light shielding layer is configured to shield light emitted by the LED 2, refracted by the substrate and then transmitted toward a pixel opening, other than the pixel opening corresponding to the LED 2, among the plurality of pixel openings 5a (for example, light refracted at a surface of the substrate 1 close to the pixel defining layer 5 and then propagating in a direction not pointing to the pixel opening 5a corresponding to the LED 2).

In the embodiment of the disclosure, the number and the positions of the LEDs 2 and corresponding first and second electrodes are not limited, and will be described in detail with reference to specific examples later.

Figure 7A:
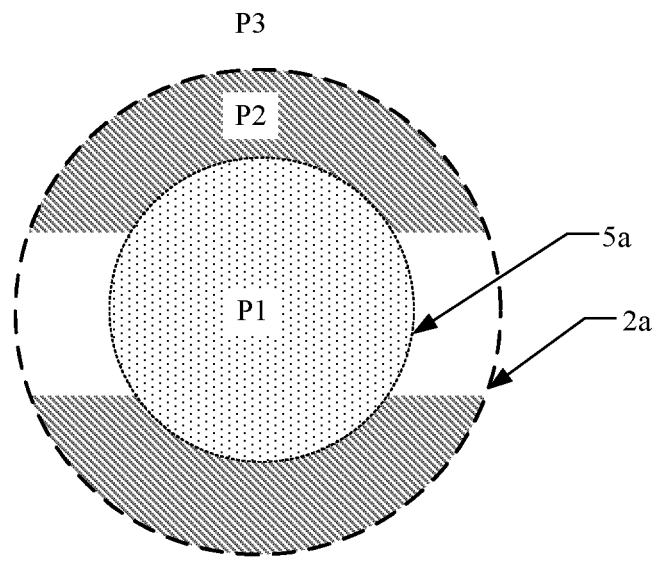
FIG. 7a is a schematic top view illustrating a case where light emitted by a LED is transmitted to a surface of a substrate close to a pixel defining layer, according to an embodiment of the disclosure.
Figure 7B:
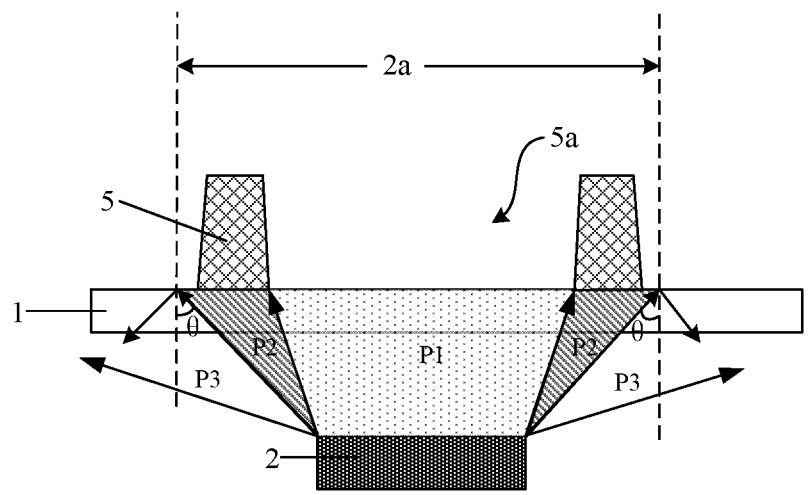
FIG. 7b is a schematic cross-sectional view illustrating the case where light emitted by a LED is transmitted to a surface of a substrate close to a pixel defining layer, according to an embodiment of the disclosure.

FIG. 7a is a schematic top view illustrating a case where light emitted by a LED is transmitted to a surface of a substrate close to a pixel defining layer, according to an embodiment of the disclosure, and FIG. 7b is a schematic cross-sectional view illustrating the case where light emitted by a LED is transmitted to a surface of a substrate close to a pixel defining layer, according to an embodiment of the disclosure. As shown in FIGS. 7a and 7b, the LED 2 is a 360° stereoscopic light emitting source, and taking a case where an area of the light emitting region of the LED 2 projected on the substrate has a shape of circle, and a pixel opening defined by the pixel defining layer 5 has a shape of circle as an example, the light emitted from a side of the LED 2 facing the substrate 1 may be divided into three parts: a first part P1 of light, that is, a part of the light emitted from the side of the LED 2 facing the substrate 1 that can be emitted from the pixel opening 5a corresponding to the LED 2 after being refracted by the surface of the substrate 1 close to the pixel defining layer 5; a third part P3 of light, that is, a part of the light emitted from the side of the LED 2 facing the substrate 1 that is subjected to total reflection on the surface of the substrate 1 close to the pixel defining layer 5 and cannot exit from the substrate 1; and a second part P2 of light, that is, the remaining part of the light emitted from the side of the LED 2 facing the substrate 1 excluding the first part P1 of light and the third part P3 of light.

The first part P1 of light and the second part P2 of light define an actual light emitting region 2a of the LED. The second part P2 of light of different LEDs (in particular, of adjacent LEDs) may overlap, resulting in a superposition and interference of light.

Figure 8A:
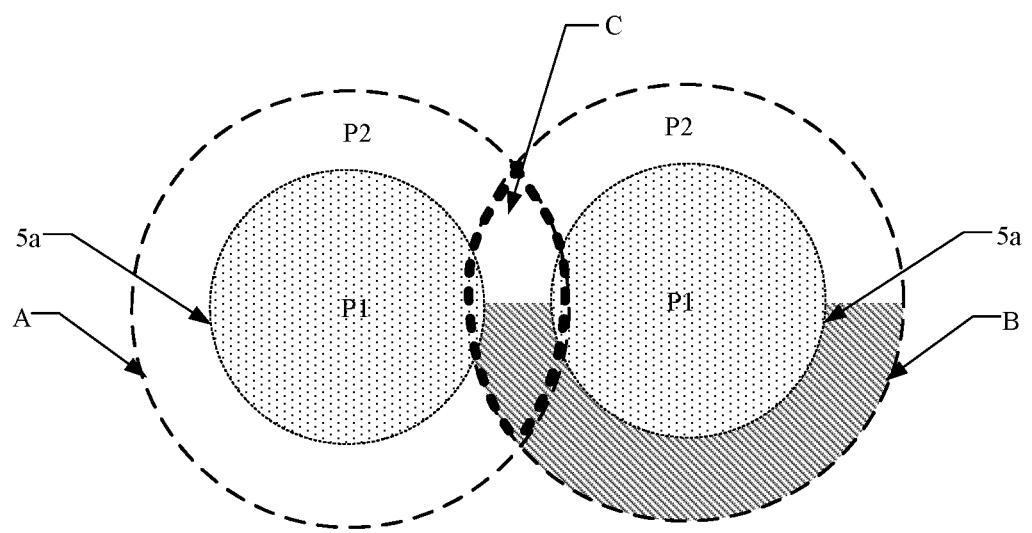
FIG. 8a is a schematic top view illustrating the problem of superposition and interference of light emitted by two LEDs in two pixel openings corresponding to the two LEDs, according to an embodiment of the disclosure.
Figure 8B:
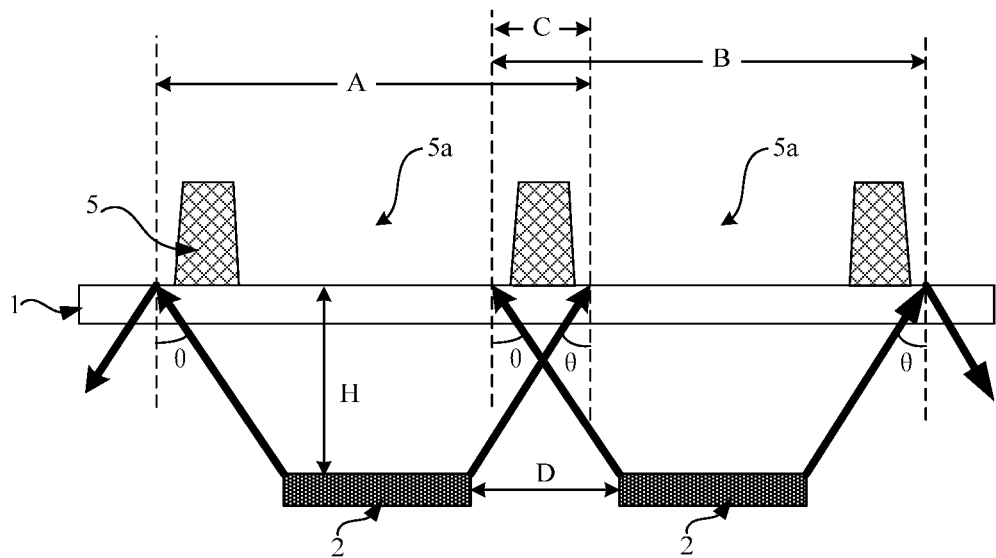
FIG. 8b is a schematic cross-sectional view illustrating the problem of superposition and interference of light emitted by two LEDs in two pixel openings corresponding to the two LEDs, according to an embodiment of the disclosure.

FIG. 8a is a schematic top view illustrating the problem of superposition and interference of light emitted by two LEDs in two pixel openings corresponding to the two LEDs, according to an embodiment of the disclosure, and FIG. 8b is a schematic cross-sectional view illustrating the problem of superposition and interference of light emitted by two LEDs in two pixel openings corresponding to the two LEDs, according to an embodiment of the disclosure. As shown in FIGS. 8a and 8b, assuming that a critical angle of total reflection of the light emitted from the substrate 1 to the outside of the substrate (for example, a critical angle of total reflection of light at a surface of the substrate 1 close to the pixel defining layer 5) is $\theta$, a region where the light emitted from the left LED 2 can be refracted at a surface of the substrate 1 close to the pixel defining layer 5 is a region A (a region where the first and second parts P1 and P2 of the light emitted from the left LED 2 irradiate on the substrate 1), and a region where the light emitted from the right LED 2 can be refracted at a surface of the substrate 1 close to the pixel defining layer 5 is a region B (a region where the first and second parts P1 and P2 of the light emitted from the right LED 2 irradiate on the substrate 1), as can be seen from the drawing, the overlapping region C of the region A and the region B is a light superposition and interference region, and in this case, the light at the overlapping region C needs to be shielded by the first light shielding layer.

In some embodiments, the first light shielding layer includes at least one light shielding pattern 11, two LEDs 2 adjacent in a preset direction correspond to one light shielding pattern 11, and a minimum width W of the light shielding pattern in the preset direction satisfies:

$$W \geq 2*H*\tan\theta - D,$$

where H is a distance between a surface of the light emission pattern 202 of the LED 2 away from the substrate 1 and a surface of the substrate 1 close to the pixel defining layer 5, $\theta$ is a critical angle of total reflection of light from the substrate 1 to an outside of the substrate (e.g., a critical angle of total reflection of light at the surface of substrate 1 close to the pixel defining layer 5), and D is a minimum distance, in the preset direction, between the two LEDs adjacent in the preset direction. The value of $\theta$ can be set according to the actual situation; the value of $\theta$ may be equal or approximately equal to $\arcsin(n2/n1)$, where n2 is the refractive index of the pixel defining layer 5, n1 is the refractive index of the substrate 1, and n2<n1.

It will be appreciated that the preset direction may be a direction parallel to any side of the substrate 1.

In the embodiments of the disclosure, as the distance H between the surface of the light emission pattern 202 of the LED 2 away from the substrate 1 and the surface of the substrate 1 close to the pixel defining layer 5 decreases, the area of the overlapping region C decreases, and the minimum width W of the required light shielding pattern 11 decreases accordingly. Taking the case where the light emitting area of the LED 2 is approximately equal to the area of the bottom (the side close to the substrate 1) of the pixel opening 5a corresponding to the LED 2 as an example, when the thickness of the substrate 1 is reduced to 80 µm, the minimum width W is calculated to be about 100 µm by simulation (the thickness of each film layer in the LED 2 is consistent with that in the existing art); and when the thickness of the substrate 1 is reduced to 50 µm, the minimum width W is calculated to be about 70 µm by simulation.

In the case where the distance between the surface of the light emission pattern 202 of the LED 2 away from the substrate 1 and the surface of the substrate 1 close to the pixel defining layer 5 is constant, the area of the overlapping region C can also be reduced by reducing the light emitting area of the LED 2, and the minimum width W of the light shielding pattern 11 required is reduced accordingly. When the thickness of the substrate 1 is reduced to 80 µm and the radius of the light emitting area of the LED 2 is 20 µm smaller than the diameter of the bottom of the pixel opening 5a corresponding to the LED 2, it is calculated by simulation that the minimum width W is reduced from about 100 µm to about 60 µm; when the thickness of the substrate 1 is reduced to 50 µm and the radius of the light emitting area of the led 2 is 20 µm smaller than the diameter of the bottom of the pixel opening 5a corresponding to the LED 2, it is calculated by simulation that the minimum width W is reduced from about 70 µm to about 30 µm.

Based on the above situation, by appropriately reducing the area of the light emitting region of the LED 2 (the area of the light emitting region is generally determined by the area of the light emission pattern 202), the area of the light emitting overlapping region of the adjacent LEDs 2 can be effectively reduced, so that the size of the required light shielding pattern 11 is reduced accordingly, which is beneficial to improving the light utilization rate and the aperture ratio. In some embodiments, the orthographic projection of the pixel opening 5a on the substrate 1 completely covers the orthographic projection of the light emission pattern 202 of the LED 2 corresponding to the pixel opening 5a on the substrate 1.

Figure 9:
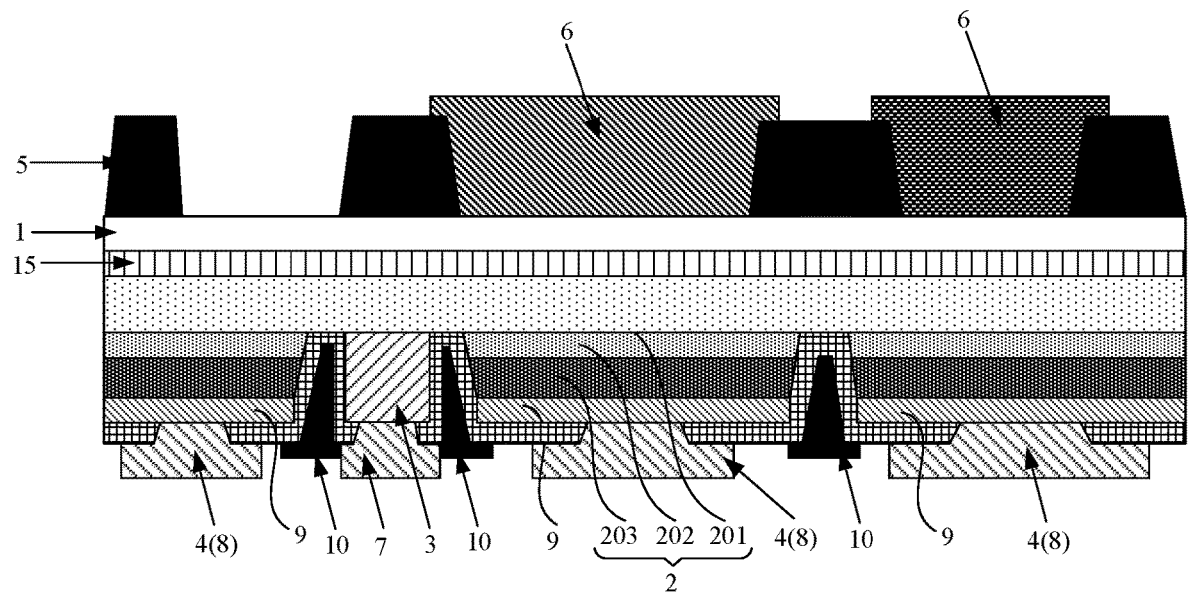
FIG. 9 is a schematic cross-sectional view of another LED chip according to an embodiment of the disclosure.

FIG. 9 is a schematic cross-sectional view of another LED chip according to an embodiment of the disclosure. As shown in FIG. 9, a material of the pixel defining layer 5 includes a light shielding material or a light reflective material; in this case, the pixel defining layer 5 can effectively avoid the problem of color mixing of the light emitted from the color conversion pattern 6 in the pixel opening 5a. It should be noted that, when the pixel defining layer 5 is made of a light reflective material, it is possible to not only avoid the above-mentioned problem of color mixing but also improve the light extraction efficiency of the color conversion pattern 6 in the pixel opening 5a.

It should be noted that, in practical applications, it may also be designed in advance such that the light emitting overlapping region of the adjacent LEDs 2 are located in the region where the pixel defining layer 5 is located, and then the pixel defining layer 5 is prepared by using a light shielding material or a light reflective material, and in this case, the pixel defining layer 5 may also be reused as the first light shielding layer to solve the problem of light superposition and interference, so that it is not necessary to additionally add a first light shielding layer.

In practical applications, it is found that after light of the first color irradiates the color conversion pattern, only a part of the light of the first color is converted into light of the second color, and another part of the light of the first color is transmitted, so that the purity of light of the second color is affected, and further, the color gamut of the display device is narrow. In order to solve the technical problem, the embodiments of the disclosure provide a corresponding solution.

Figure 10:
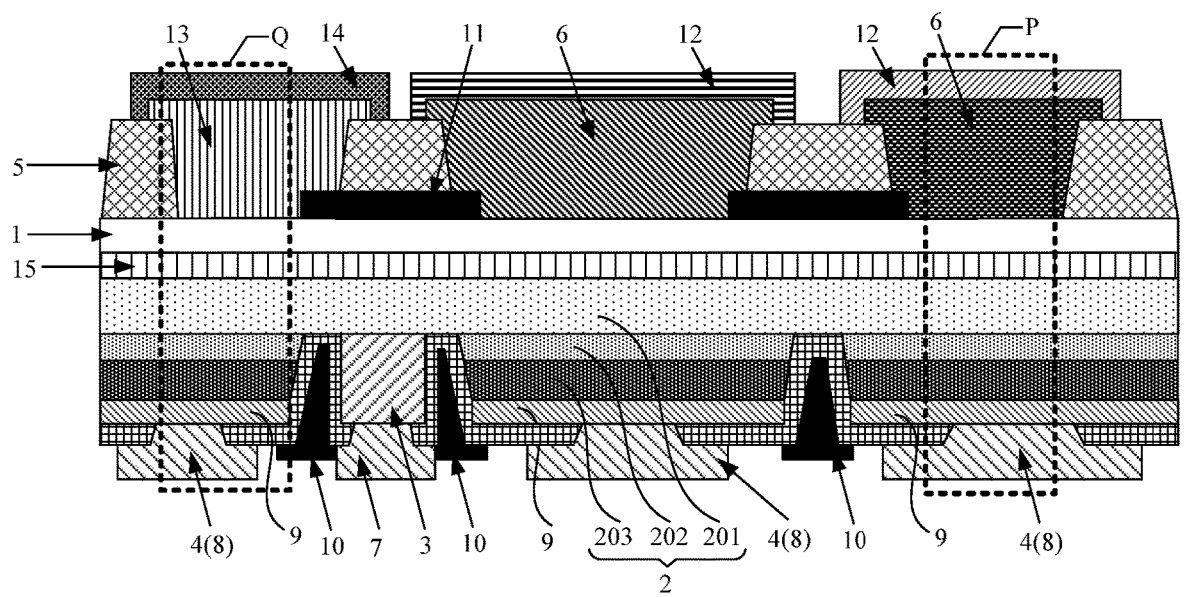
FIG. 10 is a schematic cross-sectional view of another LED chip according to an embodiment of the disclosure.

FIG. 10 is a schematic cross-sectional view of another LED chip according to an embodiment of the disclosure. As shown in FIG. 10, unlike the case shown in the previous embodiments, the LED chip shown in FIG. 10 further includes a color filter layer on a side of the pixel defining layer 5 away from the substrate 1, the color filter layer includes a plurality of first color filter patterns 12 in one-to-one correspondence with the color conversion patterns 6, and each first color filter pattern 12 is configured to block light of other colors excluding the target color converted by the color conversion pattern 6 corresponding to the first color filter pattern. In the embodiments of the disclosure, by providing the first color filter patterns 12, light of other colors (for example, the first color) transmitted through the color conversion pattern 6 can be filtered while ensuring that the light of the target color converted by the color conversion pattern 6 is transmitted, which is beneficial to improving the purity of the light of the target color, thereby improving the color gamut of the display device.

In some embodiments, some of the pixel openings 5a are provided with the color conversion patterns 6 therein, and some other of the pixel openings 5a are provided with a light transmissive pattern 13, and the light transmissive pattern 13 is configured to allow the light of the first color to pass therethrough.

Since light emitted from the color conversion pattern 6 is scattered all around, the light-exit angular spectrum at the pixel opening 5a where the color conversion pattern 6 is provided has a wide-range distribution, while the light-exit angular spectrum at the pixel opening 5a where the color conversion pattern 6 is not provided has a small-range distribution, that is, the light-exit angular spectral distribution at the pixel opening 5a where the color conversion pattern 6 is provided is not consistent with the light-exit angular spectral distribution at the pixel opening 5a where the color conversion pattern 6 is not provided, thereby affecting the display quality. To solve the above technical problem, in some embodiments, the light transmissive pattern 13 includes a light field modulation pattern configured to adjust the light-exit angular spectral distribution of the light of the first color at the pixel opening 5a, so that the light light-exit angular spectral distribution of the pixel opening 5a where the color conversion pattern 6 is provided is consistent with the light light-exit angular spectral distribution of the pixel opening 5a where the color conversion pattern 6 is not provided, thereby improving the display quality. In some embodiments, the material of the light field modulation pattern includes a material of nanoparticles, such as $TiO_x$, $SiO_x$, $CrO_x$, etc.; that is, in practical applications, nanoparticles of $TiO_x$, $SiO_x$, $CrO_x$, etc. may be deposited in the pixel openings 5a where the color conversion patterns 6 are not disposed to form the light-field modulation pattern.

In some embodiments, the LED chip further includes a plurality of second color filter patterns 14 disposed on a side of the pixel defining layer 5 and the light transmissive patterns 13 away from the substrate 1, and corresponding to the light transmissive patterns 13 one to one, an orthographic projection of each second color filter pattern 14 on the substrate 1 at least partially overlaps an orthographic projection of the light transmissive pattern 13 on the substrate 1, and the second color filter patterns 14 are configured to block light of other colors than the first color.

In some embodiments, an area of an orthographic projection, on the substrate 1, of a pixel opening 5a within which the light transmissive pattern is disposed is smaller than or equal to an area of an orthographic projection, on the substrate 1, of a pixel opening in which the color conversion pattern 6 is disposed.

In some embodiments, the light of the first color includes blue light, i.e., the light emitted by the LED 2 is blue light; and the light of the target color includes at least one of red light, green light, cyan light, magenta light, and yellow light, that is, any one of the color conversion patterns 6 may convert the light into any one of the red light, the green light, the cyan light, the magenta light, and the yellow light.

For the purpose of description, a space covered by one pixel opening in the direction perpendicular to the substrate 1 on the LED chip is referred to as a light-emitting unit, the light-emitting unit includes at least one LED 2 opposite to the pixel opening, and at least some of the light-emitting units further include color conversion patterns 6 in the pixel openings.

Figure 11A:
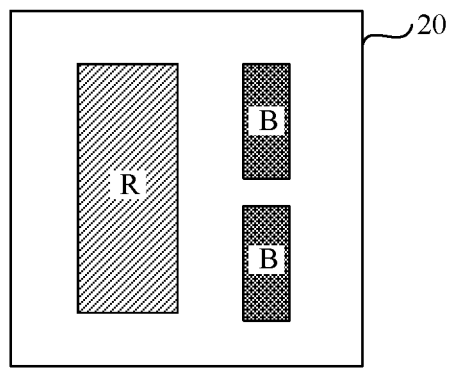
FIG. 11a is a schematic top view of an LED chip according to an embodiment of the disclosure.

FIG. 11a is a schematic top view of an LED chip according to an embodiment of the disclosure. As shown in FIG. 11a, the LED chip 20 includes three light-emitting units: two blue light-emitting units B and one red light-emitting unit R. The light-emitting area of the blue light-emitting unit B is smaller than that of the red light-emitting unit R.

Figure 11B:
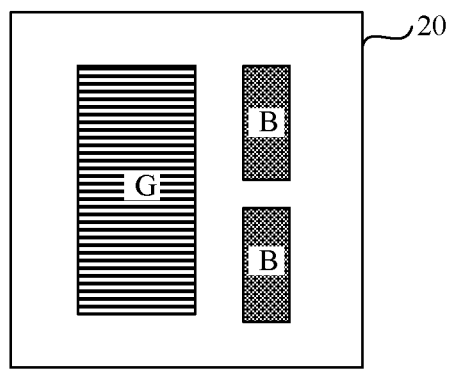
FIG. 11b is a schematic top view of another LED chip according to an embodiment of the disclosure.

FIG. 11b is a schematic top view of another LED chip according to an embodiment of the disclosure. As shown in FIG. 11b, the LED chip 20 includes three light-emitting units: two blue light-emitting units B and one green light-emitting unit G. The light emitting area of the blue light-emitting unit B is smaller than that of the green light-emitting unit G.

Figure 11C:
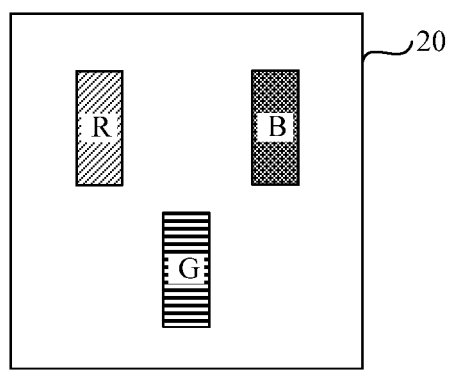
FIG. 11c is a schematic top view of another LED chip according to an embodiment of the disclosure.
Figure 11D:
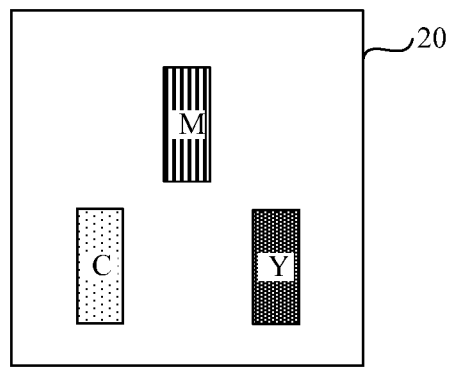
FIG. 11d is a schematic top view of another LED chip according to an embodiment of the disclosure.

The LED chip 20 includes three light-emitting units. In some embodiments, as shown in FIG. 11c, the three light-emitting units are arranged in an inverted triangle. As one example, the three light-emitting units include one blue light-emitting unit B, one red light-emitting unit R and one green light-emitting unit G, and the light-emitting areas of the blue light-emitting unit B, the red light-emitting unit R, and the green light-emitting unit G are equal. In other embodiments, as shown in FIG. 11d, the three light-emitting units are arranged in a regular triangle. As one example, the three light-emitting units include one cyan light-emitting unit C, one magenta light-emitting unit M, and one yellow light-emitting unit Y; the light emitting areas of the cyan light-emitting unit C, the magenta light-emitting unit M, and the yellow light-emitting unit Y are equal.

Figure 12A:
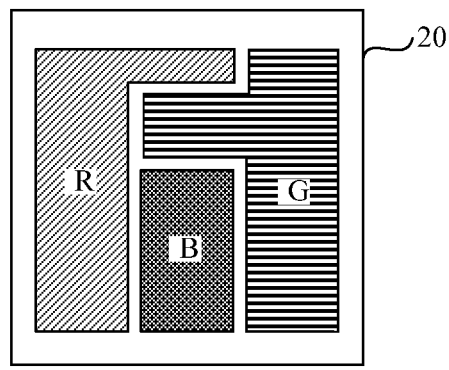
FIG. 12a is a schematic top view of another LED chip provided in the embodiment of the disclosure.
Figure 12B:
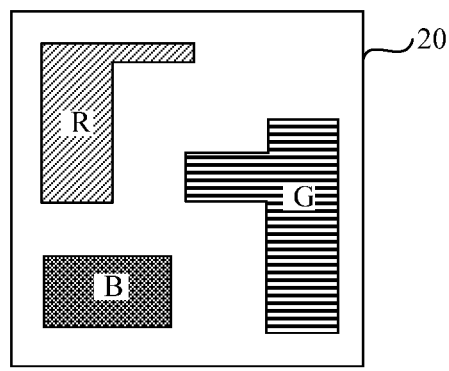
FIG. 12b is a schematic top view of another LED chip according to an embodiment of the disclosure.

FIG. 12a is a schematic top view of another LED chip 20 according to an embodiment of the disclosure, and FIG. 12b is a schematic top view of another LED chip 20 according to an embodiment of the disclosure. As shown in FIGS. 12a and 12b, the LED chip 20 includes three light-emitting units: one blue light-emitting unit B, one red light-emitting unit R, and one green light-emitting unit G; the light-emitting area of the blue light-emitting unit B is smaller than that of the red light-emitting unit R, and the light-emitting area of the blue light-emitting unit B is smaller than that of the green light-emitting unit G. The three light-emitting units in FIG. 12a are arranged compactly, and the three light-emitting units in FIG. 12b are arranged loosely. Compared with the arrangement of FIG. 12a, the arrangement of 12b provides more design space for wiring to facilitate the wiring design.

Figure 13A:
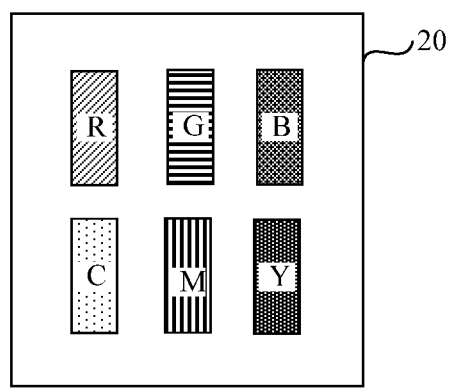
FIG. 13a is a schematic top view of another LED chip according to an embodiment of the disclosure.
Figure 13B:
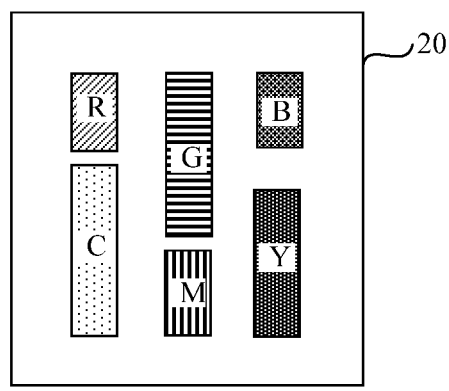
FIG. 13b is a schematic top view of another LED chip according to an embodiment of the disclosure.

FIG. 13a is a schematic top view of another LED chip according to an embodiment of the disclosure, and FIG. 13b is a schematic top view of another LED chip according to an embodiment of the disclosure. As shown in FIGS. 13a and 13b, an LED chip 20 includes six light-emitting units: one blue light-emitting unit B, one red light-emitting unit R, one green light-emitting unit G, one cyan light-emitting unit C, one magenta light-emitting unit M, and one yellow light-emitting unit Y. The six light-emitting units are arranged in two rows and three columns. Exemplarily, the three light-emitting units in the first row are respectively a red light-emitting unit R, a green pixel unit G and a blue pixel unit B, and the three light-emitting units in the second row are respectively a cyan light-emitting unit C, a magenta pixel unit M and a yellow pixel unit Y.

The light-emitting area of the blue light-emitting unit B is denoted by $S\_B$, the light-emitting area of the red light-emitting unit R is denoted by $S\_R$, the light-emitting area of the green light-emitting unit G is denoted by $S\_G$, the light-emitting area of the cyan light-emitting unit C is denoted by $S\_C$, the light-emitting area of the magenta light-emitting unit M is denoted by $S\_M$, and the light-emitting area of the yellow light-emitting unit Y is denoted by $S\_Y$. In the case shown in FIG. 13a, $S\_B$, $S\_R$, $S\_G$, $S\_C$, $S\_M$, $S\_Y$ are approximately equal. In the case shown in FIG. 13b, $S\_C \approx S\_G > S\_Y > S\_R \approx S\_M > S\_B$.

In the embodiments of the disclosure, the blue light-emitting unit B may has an exemplary structure as shown in a portion Q of FIG. 10, that is, the blue light-emitting unit B includes a LED 2 emitting blue light, a light field modulation pattern and a blue filter pattern (configured to allow blue light to pass therethrough and to filter non-blue light); the red/green/magenta/cyan/yellow pixel unit may has an exemplary structure as shown in a portion P of FIG. 10, i.e., the red/green/magenta/cyan/yellow pixel unit includes a LED 2 emitting blue light, a red/green/magenta/cyan/yellow light conversion pattern 6 (converting the blue light into red/green/magenta/cyan/yellow light), and a red/green/magenta/cyan/yellow filter pattern (configured to allow only red/green/magenta/cyan/yellow light to pass therethrough). Therefore, the purity of the light emitted by each light-emitting unit can be improved, and the display quality of the display device can be improved. Here, a detailed description of the specific structure of each light-emitting unit will not be given here.

In the embodiments of the disclosure, the arrangement of the light-emitting units in the LED chip 20, the color of the emitted light, the shape of the light emitting region, and the area of the light emitting region are not limited, and the specific parameters may be set according to actual requirements.

The embodiments of the disclosure also provide a method for manufacturing an LED chip, which can be used to manufacture the LED chip provided in the foregoing embodiments, and will be described in detail below with reference to the accompanying drawings.

Figure 14:
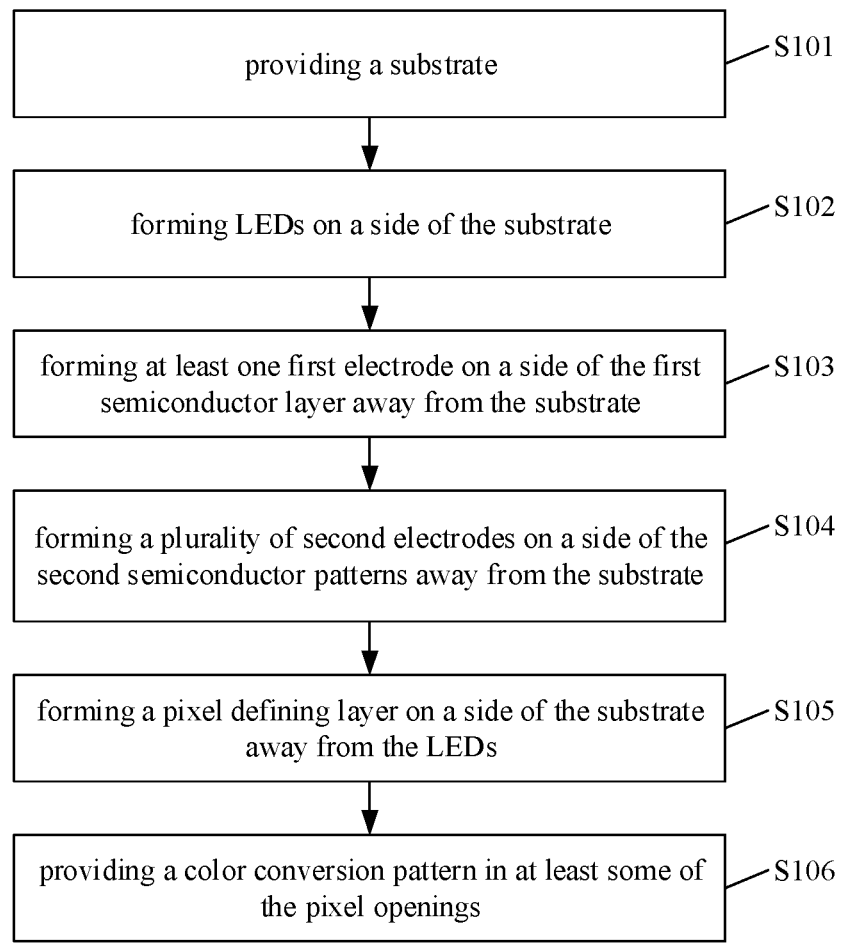
FIG. 14 is a flowchart of a method for manufacturing an LED chip according to an embodiment of the disclosure.

FIG. 14 is a flowchart of a method for manufacturing an LED chip according to an embodiment of the disclosure. As shown in FIG. 14, the method includes steps S101 to S106.

In step S101, a substrate is provided.

The substrate may be a substrate of various types, and for example, the substrate may be a GaP substrate, a GaAs substrate, a silicon substrate, a silicon carbide substrate, a sapphire substrate, or the like.

It should be noted that the type of the substrate may be determined according to the materials of the first semiconductor pattern and the second semiconductor pattern to be formed later. Exemplarily, in the case where the intrinsic semiconductor materials of the first and second semiconductor patterns are GaP, AlGaAs, AlGaInP, or the like, the substrate may be a GaP substrate or a GaAs substrate. In the case where the intrinsic semiconductor materials of the first and second semiconductor patterns are GaN, the substrate may be a silicon carbide substrate, a sapphire substrate, or the like.

In step S102, a plurality of LEDs are formed on a side of the substrate.

Exemplarily, any two adjacent LEDs have a gap therebetween, the LED includes a first semiconductor pattern, a light emission pattern, and a second semiconductor pattern that are sequentially stacked, and the first semiconductor patterns of at least two LEDs are formed integrally as a single piece to constitute a first semiconductor layer.

In the disclosure, methods for forming a plurality of LEDs on a side of a substrate are various, and may be selected according to actual needs. A method for forming a plurality of LEDs is exemplarily described below, but the method for forming a plurality of LEDs is not limited to the following examples.

Figure 15:
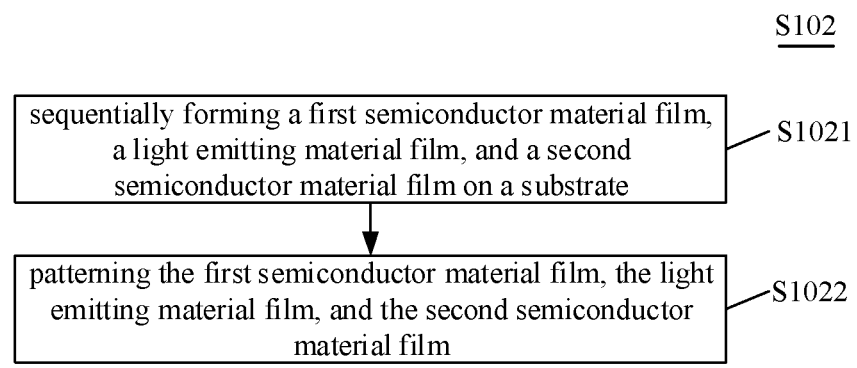
FIG. 15 is a flowchart illustrating one implementation of step S102 in the disclosure.

FIG. 15 is a flowchart illustrating one implementation of step S102 in the disclosure. As shown in FIG. 15, step S102 includes steps S1021 and S1022.

In step S1021, a first semiconductor material film, a light emitting material film, and a second semiconductor material film are sequentially formed on a substrate. Exemplarily, the first semiconductor material film, the light emitting material film, and the second semiconductor material film may be epitaxially grown sequentially on a side of the substrate by using a Metal Organic Chemical Vapor Deposition (MOCVD) process. Here, as for the selected materials of the first semiconductor material film, the light emitting material film, and the second semiconductor material film, reference may be made to the description of the materials of the first semiconductor pattern, the light emission pattern, and the second semiconductor pattern in the foregoing embodiments, and details are not repeated here.

In step S1022, the first semiconductor material film, the light emitting material film, and the second semiconductor material film are patterned to form a first semiconductor pattern, a light emission pattern, and a second semiconductor pattern, thereby obtaining a plurality of LEDs. At least two first semiconductor patterns are communicated with each other to constitute a first semiconductor layer.

Exemplarily, the second semiconductor material film, the light emitting material film, and the first semiconductor material film may be patterned using a photolithography process.

Here, in the patterning process of the second semiconductor material film, the light emitting material film, and the first semiconductor material film, the etching depth may be, for example, greater than or equal to the thickness (i.e., the dimension in the direction perpendicular to the substrate) of the second semiconductor material film and less than the sum of the thicknesses of the second semiconductor material film, the light emitting material film, and the first semiconductor material film.

For example, in the case where the etching depth is greater than or equal to the thickness of the second semiconductor material film and less than the sum of the thicknesses of the second semiconductor material film and the light emitting material film (as shown in FIGS. 1 to 4, for example), a plurality of second semiconductor patterns spaced apart from each other and independent of each other may be first formed.

In this case, the edge portion of the patterned light emitting material film may be further patterned (for example, by using a photolithography process) to expose the patterned first semiconductor material film. At this time, a light emitting layer (in which a plurality of light emission patterns 202 in a plurality of LEDs are all communicated with each other) and a first semiconductor layer (in which a plurality of first semiconductor patterns in a plurality of LEDs are all communicated with each other) are obtained.

It should be noted that, in further patterning the edge portion of the patterned light-emitting material film, the portion of the patterned light-emitting material film located in the gap between any two adjacent second semiconductor patterns may be etched at the same time to obtain a plurality of light emission patterns.

It should be noted that, in the process of further patterning the edge portion of the patterned light-emitting material film or further patterning the edge portion of the patterned light-emitting material film and a portion of the patterned light-emitting material film located in the gap between any two adjacent second semiconductor patterns, the etching depth may be a thickness of the light emitting material film, so that only a surface of the patterned first semiconductor material film is exposed, or the etching depth may be greater than the thickness of the light emitting material film and less than the sum of the thicknesses of the light emitting material film and the first semiconductor material film, i.e., a portion of the patterned first semiconductor material film is etched away. This can facilitate the formation of a good electric connection between the subsequently formed first electrode and the first semiconductor layer.

In the case where the etching depth is greater than or equal to the sum of the thicknesses of the second semiconductor material film and the light emitting material film and less than the sum of the thicknesses of the second semiconductor material film, the light emitting material film, and the first semiconductor material film, the surface of the patterned first semiconductor thin film may be exposed to form a plurality of second semiconductor patterns, a plurality of light emission patterns, and a first semiconductor layer (in which, for example, the first semiconductor patterns of at least two LEDs are integrally formed as a single piece).

The shape, size and arrangement of the plurality of LEDs obtained by step S1022 can be selected according to actual requirements.

In step S103, at least one first electrode is formed on a side of the first semiconductor layer away from the substrate.

Exemplarily, the first electrode may be formed using a photolithography process. The material of the first electrode may include titanium (Ti), aluminum (Al), nickel (Ni), gold (Au), or the like.

In step S104, a plurality of second electrodes are formed on a side of the second semiconductor patterns away from the substrate, each of the second electrodes being electrically coupled to the second semiconductor pattern of at least one LED.

Exemplarily, the material of the second electrode 3 may include, for example, Ti, Al, Ni, Au, copper (Cu), indium (In), tin (Sn), silver (Ag), or Sn alloy, etc.

In some embodiments, the substrate may be thinned after step S104 is completed.

In step S105, a pixel defining layer is formed on a side of the substrate away from the LEDs.

The pixel defining layer is provided with a plurality of pixel openings in one-to-one correspondence with the LEDs. Exemplarily, the pixel defining layer may be formed using a photolithography process.

In step S106, a color conversion pattern is provided in at least some of the pixel openings.

The color conversion pattern is configured to convert light of a first color emitted by the light emission pattern into light of a target color different from the first color. The color conversion pattern is made of a wavelength conversion material, such as a cadmium compound quantum dot, an indium compound quantum dot, a perovskite type quantum dot, a rare earth phosphor powder, an organic fluorescent material, and the like, and converts light emitted by the LED into other colors by using the wavelength conversion property thereof, thereby realizing colorful and even full-color display.

It should be noted that, light of target colors converted by the color conversion patterns disposed in the different pixel openings may be light of the same color or light of different colors, which may be determined according to actual needs.

Figure 16:
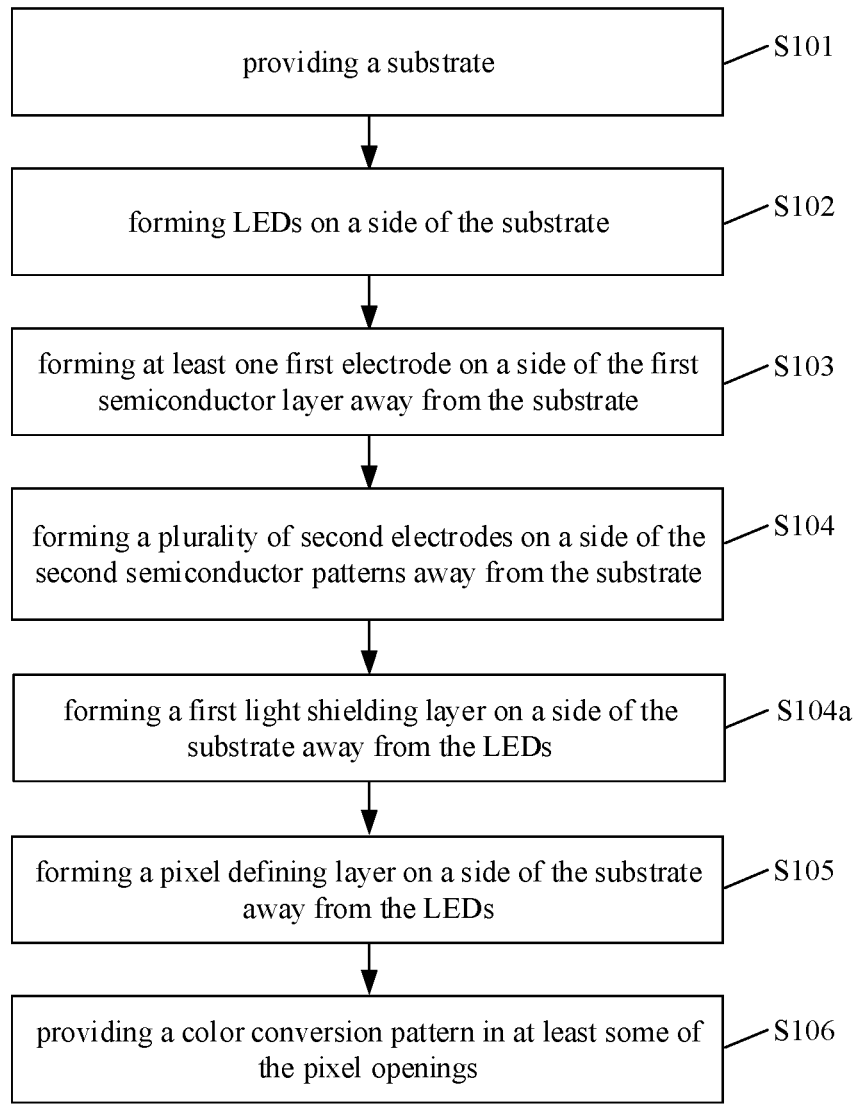
FIG. 16 is a flowchart of a method for manufacturing an LED chip according to an embodiment of the disclosure.

FIG. 16 is a flowchart of a method for manufacturing an LED chip according to an embodiment of the disclosure. As shown in FIG. 16, the method for manufacturing an LED chip shown in FIG. 16 includes steps S101 to S106 shown in FIG. 14, and further includes step S104a between step S104 and step S105. For the description of steps S101 to S106 in this embodiment, reference may be made to the corresponding contents in the embodiments, and only step S104a is described in detail below.

In step S104a, a first light shielding layer is formed on a side of the substrate away from the LEDs.

Exemplarily, the first light shielding layer may be formed by a photolithography process. The first light shielding layer includes a plurality of light shielding patterns, and parameters such as arrangement, size, shape and the like of the light shielding patterns can be selected and set according to actual needs.

In some embodiments, the method may further include a step of forming a buffer layer on the substrate between step S101 and step S102.

In some embodiments, the method may further include, between step S102 and step S103, a step of forming an ohmic contact pattern on a side of the second semiconductor pattern away from the substrate and a step of forming an insulating layer on a side of the ohmic contact pattern away from the substrate.

In some embodiments, in step S104, first and second conductive pins may be formed at the same time when a plurality of second electrodes are formed on the side of the second semiconductor pattern away from the substrate, where the first conductive pin is electrically coupled to at least one first electrode, and the second conductive pin is electrically coupled to a corresponding second electrode.

In some embodiments, the method may further include a step of disposing a third light shielding layer at a gap between two adjacent LEDs between step S104 and step S105.

In some embodiments, in step S105, the material of the pixel defining layer includes a light shielding material or a light reflective material.

In some embodiments, the color conversion pattern is disposed in some pixel openings, and a light transmissive pattern (light field modulation pattern) is disposed in some other pixel openings, and the method may further include forming the light transmissive pattern in some pixel openings after step S105.

In some embodiments, the method may further include a step of forming a first color filter pattern and a second color filter pattern on a side of the pixel defining layer away from the substrate after step S106.

For the related descriptions of the buffer layer, the ohmic contact pattern, the insulating layer, the first conductive pin, the second conductive pin, the third light shielding layer, the light transmissive pattern (the light field modulation pattern), the first color filter pattern, and the second color filter pattern, reference may be made to the contents in the foregoing embodiments, and details are not repeated here.

The embodiments of the disclosure also provide a display device, which will be described in detail below with reference to the accompanying drawings.

Figure 17:
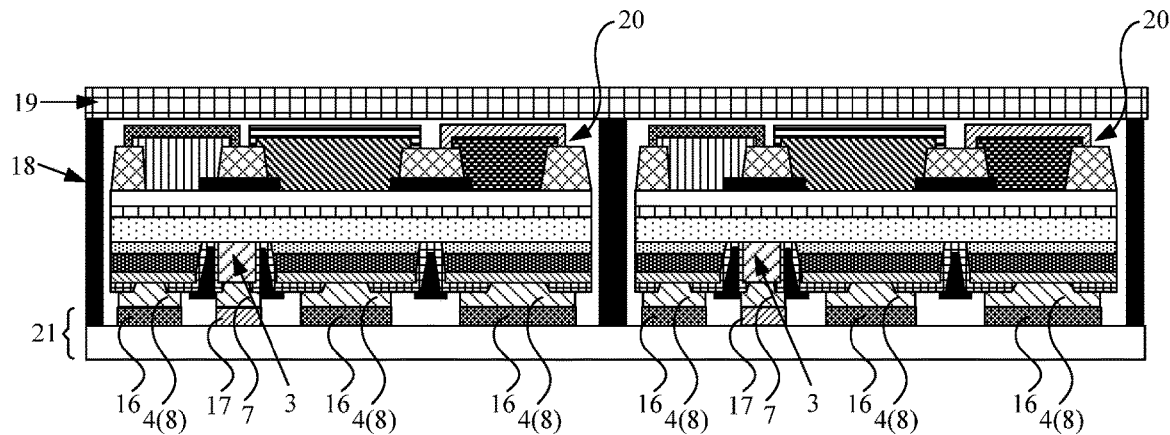
FIG. 17 is a schematic cross-sectional view of a display device according to an embodiment of the disclosure.

FIG. 17 is a schematic cross-sectional view of a display device according to an embodiment of the disclosure. As shown in FIG. 17, the display device includes a driving backplane 21 and a plurality of LED chips.

The driving backplane 21 includes a plurality of connection pads including a plurality of first pads 17 and a plurality of second pads 16; the LED chip 20 may be the LED chip 20 according to the above embodiment, each first electrode 3 of the LED chip 20 is electrically coupled to one first pad 17, and each second electrode 4 in the LED chip 20 is electrically coupled to one second pad 16.

In some embodiments, a second light shielding layer 18 is disposed between any two adjacent LED chips 20. The second light shielding layer 18 can prevent superposition and interference of light between adjacent LED chips 20.

In some embodiments, an encapsulation layer 19 is disposed on a side of the second light shielding layer 18 and the LED chips 20 away from the substrate, and can be used to encapsulate the LED chips 20 in the display device, so as to isolate moisture and oxygen and ensure stable operation of the color conversion material. The second light shielding layer 18 is located between the driving backplane 21 and the encapsulation layer 19 in the vertical direction and between the adjacent LED chips 20 in the horizontal direction.

As an example, the encapsulation layer 19 may be a laminated structure in which organic encapsulation layers and inorganic encapsulation layers are alternately disposed.

As another example, the encapsulation layer is formed by drying and curing an encapsulation glue. In the applying of the encapsulation glue, the encapsulation glue can automatically fill the gap between the LED chips, and after drying and curing are completed, the encapsulation layer can play a role in blocking moisture and oxygen on one hand and a role in fixing the LED chips on the other hand.

In some embodiments, the number of the first electrodes 3 is less than the number of the second electrodes 4 in each LED chip 20, and the number of the first pads 17 electrically coupled to the first electrodes 3 may be less than the number of the second pads 16 electrically coupled to the second electrodes 4. For example, each LED chip 20 has one first electrode 3 and a plurality of second electrodes 4. In this case, one of the first pads 17 and multiple second pads 16 may be divided into one group, and may be electrically coupled to one LED chip 20.

In some embodiments, the driving backplane 21 is configured to transport, through the first pad 17, electrons to the first electrode 3 of the LED chip 20 electrically coupled to the first pad 17 and to transport, through the second pad 16, holes to one second electrode 4 of the plurality of second electrodes 4 of the LED chip 20 electrically coupled to the second pad 16, so that the electrons and the holes are recombined in the light emission pattern in the corresponding LED to emit light.

In some embodiments, in the case where the LED chips 20 include the first and second pins 7 and 8, the first electrode 3 of each LED chip 20 may be electrically coupled to one first pad 17 through the first conductive pin 7, and the second electrode 4 of each LED chip 20 may be electrically coupled to one second pad 16 through the second conductive pin 8.

It should be noted that the display device provided in the embodiment of the disclosure is different from the existing art in that each pixel is an independent and separate structure, instead of an array structure formed by sequentially stacking film materials on a large-sized substrate through a film formation process and patterning the film materials.

The display device according to the embodiments of the disclosure has the same beneficial effects as the LED chips in some embodiments described above, and the details are not repeated herein.

In some embodiments, the driving backplane may be, for example, a backplane in a backlight module of a Liquid Crystal Display (LCD). In this case, the LED chip 20 may serve as a light source, and the display device may serve as a backlight module in the LCD to provide backlight for image display of the LCD.

In some other embodiments, the driving backplane may be a display backplane, for example. In this case, the LED chip 20 may be provided as a part of the plurality of sub-pixels, and the display device may be provided as an LED display device for image display. The display device may be a Mini LED display device or a Micro LED display device.

In some embodiments, the display device is any product or component having a display function, such as a mobile phone, a tablet computer, a television, a display, a notebook computer, a digital photo frame, a navigator, or the like.

The embodiments of the disclosure further provide a method for manufacturing a display device, which can be used to manufacture the display device provided in the foregoing embodiments, and will be described in detail below with reference to the accompanying drawings.

Figure 18:
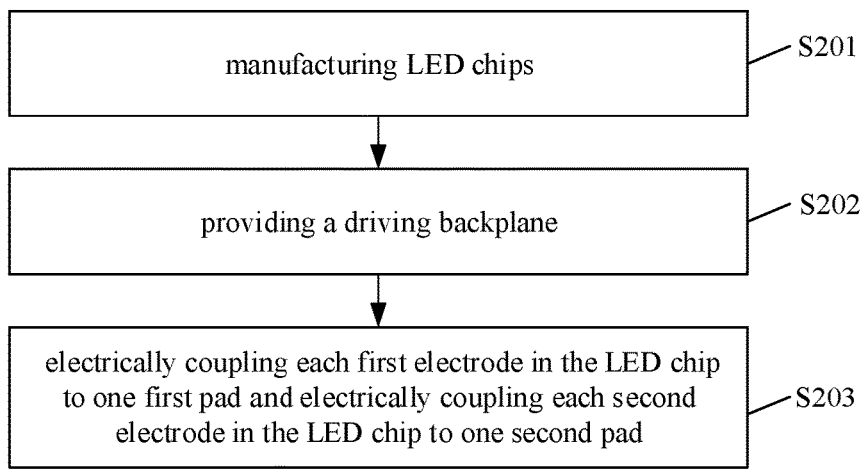
FIG. 18 is a flowchart of a method for manufacturing a display device according to an embodiment of the disclosure.

FIG. 18 is a flowchart of a method for manufacturing a display device according to an embodiment of the disclosure. As shown in FIG. 18, the method includes steps S201 to S203.

In step S201, LED chips are manufactured.

In step S201, a plurality of LED chips may be manufactured based on the method for manufacturing LED chips according the previous embodiments. The light-emitting units included in different LED chips may be the same or different.

Figure 19A:
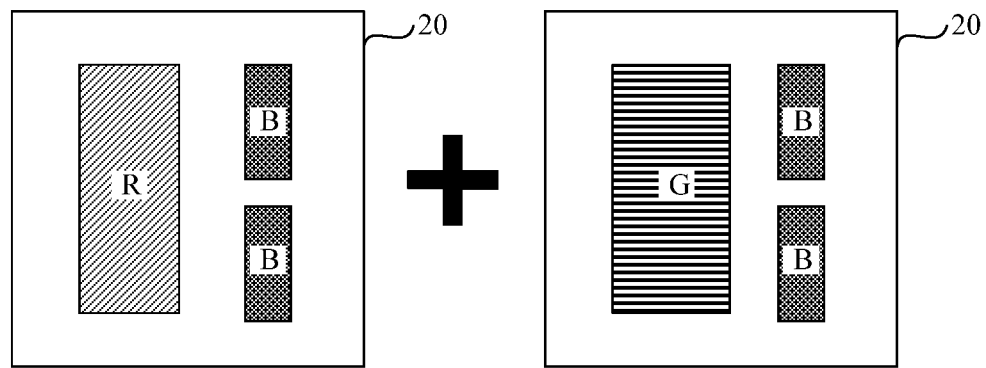
FIG. 19a is a schematic top view of two LED chips having different light-emitting units and used in a display device according to an embodiment of the disclosure.

FIG. 19a is a schematic top view of two LED chips having different light-emitting units and used in a display device according to an embodiment of the disclosure. As shown in FIG. 19a, as an example, the LED chip on the left side in FIG. 19a includes three light-emitting units: two blue light-emitting units B and one red light-emitting unit R; the LED chip on the right side in FIG. 19a includes three light-emitting units: two blue light-emitting units B and one green light-emitting unit G.

Figure 19B:
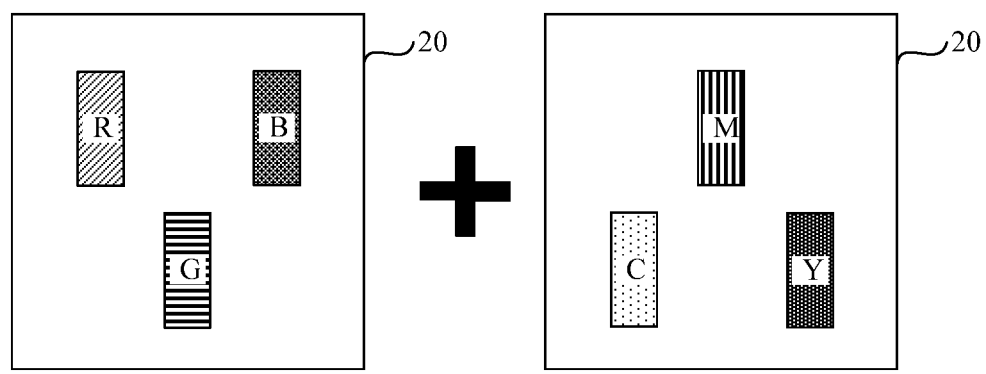
FIG. 19b is another schematic top view of two LED chips having different light-emitting units and used in a display device according to an embodiment of the disclosure.

FIG. 19b is another schematic top view of two LED chips including different light-emitting units and used in the display device according to an embodiment of the disclosure. As shown in FIG. 19b, as another example, the LED chip on the left side in FIG. 19b includes three light-emitting units: one blue light-emitting unit B, one red light-emitting unit R, and one green light-emitting unit G; the LED chip on the right side in FIG. 19b includes three light-emitting units: one cyan light-emitting unit C, one magenta light-emitting unit M, and one yellow light-emitting unit Y.

Figure 19C:
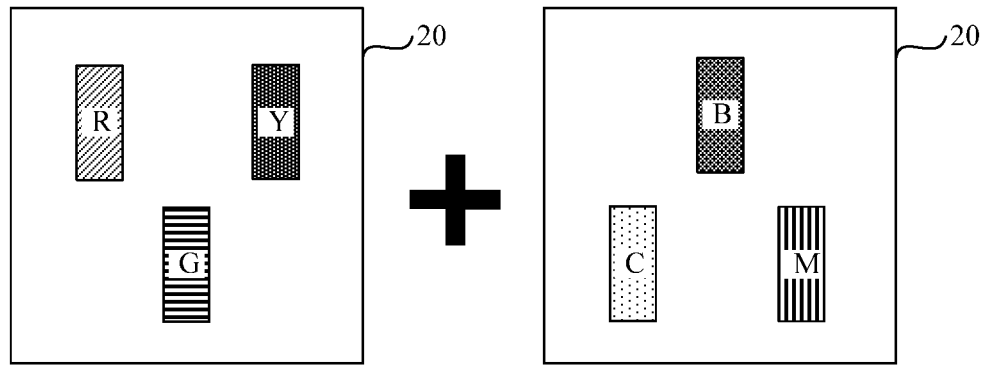
FIG. 19c is another schematic top view of two LED chips having different light-emitting units and used in a display device according to an embodiment of the disclosure.

FIG. 19c is another schematic top view of two LED chips having different light-emitting units and used in a display device according to an embodiment of the disclosure. As shown in FIG. 19c, as another example, the LED chip on the left side in FIG. 19c includes three light-emitting units: one blue light-emitting unit B, one red light-emitting unit R, and one yellow light-emitting unit; the LED chip on the right side in FIG. 19c includes three light-emitting units: one cyan light-emitting unit C, one magenta light-emitting unit M, and one blue light-emitting unit B.

In step S202, a driving backplane is provided.

The driving backplane includes a plurality of connection pads, and the connection pads include a plurality of first pads and a plurality of second pads.

In step S203, each first electrode in the LED chip is electrically coupled to one first pad and each second electrode in the LED chip is electrically coupled to one second pad.

The LED chips may be transferred to the driving backplane in a chip-by-chip transfer or batch transfer manner. For the specific description of step S202 and step S203, reference may be made to the corresponding contents in the foregoing embodiments, and details are not repeated here.

Figure 20:
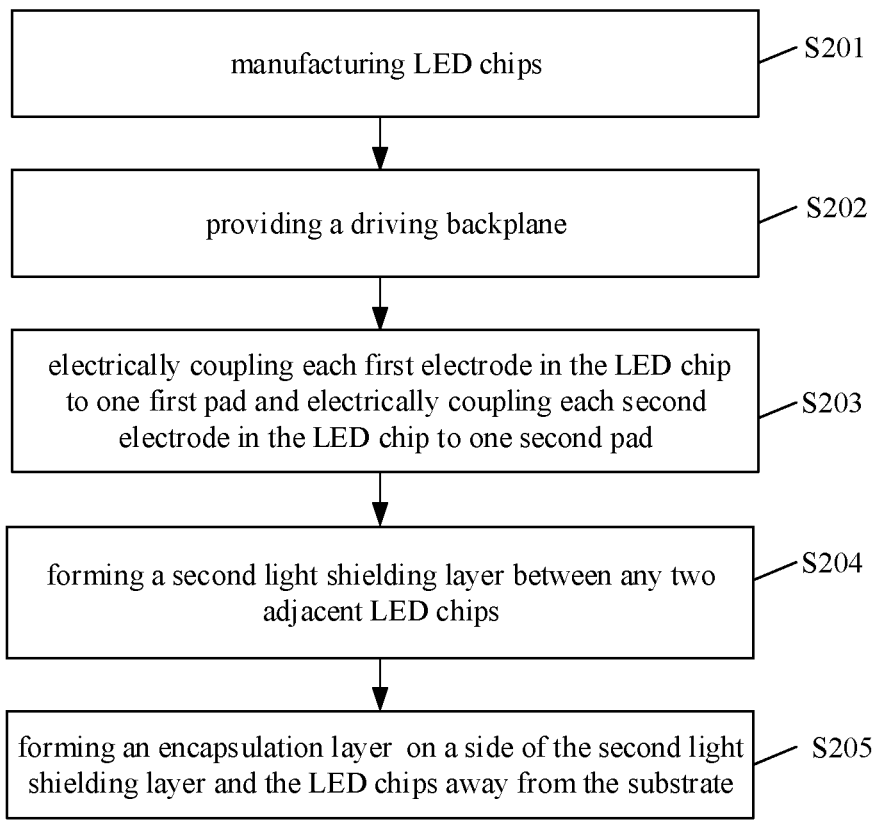
FIG. 20 is a flowchart of a method for manufacturing a display device according to an embodiment of the disclosure.

FIG. 20 is a flowchart of a method for manufacturing a display device according to an embodiment of the disclosure. As shown in FIG. 20, the method includes steps S201 to S203 shown in FIG. 18, and further includes step S204 and step S205 after step S203; for the description of steps S201 to S203 in this embodiment, reference may be made to the corresponding contents in the above embodiments, and only step S204 and step S205 will be described in detail below.

In step S204, a second light shielding layer is formed between any two adjacent LED chips.

In step S205, an encapsulation layer is formed on a side of the second light shielding layer and the LED chips away from the substrate.

For specific descriptions of the second light shielding layer and the encapsulation layer, reference may be made to corresponding contents in the foregoing embodiments, and details are not repeated here.

It can be understood that the foregoing embodiments are merely exemplary embodiments used for describing the principle of the disclosure, but the disclosure is not limited thereto. Those of ordinary skill in the art may make various variations and improvements without departing from the spirit and essence of the present invention, and these variations and improvements shall also fall into the protection scope of the disclosure.

What is claimed is:

1. A light emitting diode (LED) chip, comprising:
   a substrate;
   a plurality of LEDs on a side of the substrate, each of the plurality of LEDs comprising a first semiconductor pattern, a light emission pattern, and a second semiconductor pattern which are sequentially stacked, the first semiconductor patterns of at least two of the plurality of LEDs being formed as a single piece to constitute a first semiconductor layer;
   at least one first electrode on a side of the first semiconductor layer away from the substrate and electrically coupled to the first semiconductor layer;
   a plurality of second electrodes on a side of the second semiconductor patterns away from the substrate, each of the plurality of second electrodes being electrically coupled to the second semiconductor pattern of a corresponding one of the plurality of LEDs;
   a pixel defining layer on a side of the substrate away from the LEDs, and having a plurality of pixel openings in one-to-one correspondence with the plurality of LEDs; and
   a color conversion pattern within at least two of the plurality of pixel openings, the color conversion pattern being configured to convert light of a first color emitted by the light emission pattern into light of a target color other than the first color,
   wherein the LED chip is a Mini-LED chip or a Micro-LED chip.

2. The LED chip of claim 1, further comprising:
   a first light shielding layer between the pixel defining layer and the substrate in a vertical direction, and between adjacent ones of the plurality of LEDs when viewed in a plan view, the first light shielding layer being configured to shield light emitted by at least one of the adjacent LEDs and refracted by the substrate and then transmitted toward a pixel opening, other than a pixel opening corresponding to the at least one of the adjacent LEDs, among the plurality of pixel openings.

3. The LED chip of claim 2, wherein the first light shielding layer comprises at least one light shielding pattern between two of the plurality of LEDs adjacent in a preset direction when viewed in a plan view, and a minimum width W of the light shielding pattern in the preset direction satisfies:

$$W \leq 2*H*\tan\theta - D,$$

where H is a distance between a surface of the light emission pattern of the LED away from the substrate and a surface of the substrate close to the pixel defining layer, θ is a critical angle of total reflection of light from the substrate to an outside of the substrate, and D is a minimum distance, in the preset direction, between the two LEDs adjacent in the preset direction.

4. The LED chip of claim 1, wherein the pixel defining layer comprise a light shielding material or a light reflective material.

5. The LED chip of claim 1, wherein
the color conversion patterns in different ones of the pixel openings convert the light of the first color emitted from the light emission patterns into light of target colors different from each other, respectively, and
the LED chip further comprises: a color filter layer on a side of the pixel defining layer away from the substrate and comprising a plurality of first color filter patterns in one-to-one correspondence with the color conversion patterns, each of the first color filter patterns being configured to block light of a color other than the target color converted by the color conversion pattern corresponding to the first color filter pattern.

6. The LED chip of claim 1, wherein an orthographic projection of each pixel opening on the substrate completely covers an orthographic projection of the light emission pattern of the LED corresponding to the pixel opening on the substrate.

7. The LED chip of claim 1, further comprising: a light transmissive pattern within a pixel opening, in which the color conversion pattern is not disposed, of the plurality of pixel openings, the light transmissive pattern being configured to allow light of the first color to pass therethrough.

8. The LED chip of claim 7, wherein the light transmissive pattern comprises a light field modulation pattern configured to adjust a light-exit angular spectral distribution of the light of the first color at the pixel opening.

9. The LED chip of claim 7, further comprising: a second color filter pattern on a side of the pixel defining layer and the light transmissive pattern away from the substrate, an orthographic projection of the second color filter pattern on the substrate at least partially overlapping an orthographic projection of the light transmissive pattern on the substrate, and the second color filter pattern being configured to block light of a color other than the first color.

10. The LED chip of claim 7, wherein an area of an orthographic projection, on the substrate, of a pixel opening within which the light transmissive pattern is disposed is smaller than or equal to an area of an orthographic projection, on the substrate, of a pixel opening in which the color conversion pattern is disposed.

11. The LED chip of claim 1, wherein the light of the first color comprises blue light, and
the light of the target color comprises at least one of red light, green light, cyan light, magenta light, or yellow light.

12. The LED chip of claim 1, further comprising: a third light shielding layer in gaps between the plurality of LEDs and made of a light shielding material.

13. The LED chip of claim 12, wherein at least a portion of the third light shielding layer protrudes in a vertical direction beyond a surface of the light emission pattern away from the second semiconductor pattern.

14. The LED chip of claim 12, further comprising: a buffer layer between the substrate and the first semiconductor layer, the buffer layer having a lattice coefficient and a thermal expansion coefficient closer to those of the first semiconductor layer than the substrate.

15. A method for manufacturing a LED chip, the LED chip being a Mini-LED chip or a Micro-LED chip, the method comprising:

providing a substrate;
forming a plurality of LEDs on a side of the substrate, each of the LEDs comprising a first semiconductor pattern, a light emission pattern, and a second semiconductor pattern which are sequentially stacked, the first semiconductor patterns of at least two of the plurality of LEDs being formed as a single piece to constitute a first semiconductor layer;
forming at least one first electrode on a side of the first semiconductor layer away from the substrate, the first electrode being electrically coupled to the first semiconductor layer;
forming a plurality of second electrodes on a side of the second semiconductor patterns away from the substrate, each of the second electrodes being electrically coupled to the second semiconductor pattern of a corresponding one of the plurality of LEDs;
forming a pixel defining layer on a side of the substrate away from the plurality of LEDs, the pixel defining layer having a plurality of pixel openings in one-to-one correspondence with the plurality of LEDs; and
forming a color conversion pattern within at least two of the plurality of pixel openings, the color conversion pattern being configured to convert light of a first color emitted by the light emission pattern to light of a target color other than the first color.

16. The method of claim 12, wherein, before the forming of a pixel defining layer on a side of the substrate away from the plurality of LEDs, the method further comprises:
forming a first light shielding layer on a side of the substrate away from the plurality of LEDs, the first light shielding layer being between adjacent ones of the plurality of LEDs when viewed in a plan view, and configured to shield light that is emitted by at least one of the adjacent LEDs, refracted by the substrate, and then transmitted towards a pixel openings, other than a pixel opening corresponding to the at least one of the adjacent LEDs, of the plurality of pixel openings.

17. A display device, comprising:
a driving backplane comprising a plurality of connection pads, the plurality of connection pads comprising a plurality of first pads and a plurality of second pads; and
a plurality of LED chips, each LED chip being the LED chip of claim 1, the plurality of first pads being electrically coupled to first electrodes of the plurality of LED chips in a one-to-one correspondence manner, and the plurality of second pads being electrically coupled to second electrodes of the LED chips in a one-to-one correspondence manner.

18. The display device of claim 17, further comprising:
an encapsulation layer on a side of the plurality of LED chips away from the driving backplane; and
a second light shielding layer, which is between the driving backplane and the encapsulation layer in a vertical direction, and between any two adjacent ones of the plurality of LED chips in a horizontal direction.

19. A method for manufacturing a display device, comprising:
manufacturing a plurality of LED chips by adopting the method of claim 15;
providing a driving backplane which comprises a plurality of connection pads, the plurality of connection pads comprising a plurality of first pads and a plurality of second pads; and
electrically connecting the plurality of first pads with first electrodes of the plurality of LED chips in a one-to-one correspondence manner and electrically connecting the plurality of second pads with second electrodes of the plurality of LED chips in a one-to-one correspondence manner.

20. The method of claim 19, wherein, after the electrically connecting the plurality of first pads and the first electrodes of the plurality of LED chips in a one-to-one correspondence, and the electrically connecting the plurality of second pads and the second electrodes of the plurality of LED chips in a one-to-one correspondence, the method further comprises:

forming a second light shielding layer on a side of the driving backplane close to the plurality of LED chips, the second light shielding layer being between any two adjacent ones of the plurality of LED chips in a horizontal direction; and forming an encapsulation layer on a side of the plurality of LED chips away from the driving backplane.

\* \* \* \* \*